United States Patent
Kuromitsu et al.

(10) Patent No.: US 8,609,993 B2
(45) Date of Patent: Dec. 17, 2013

(54) POWER MODULE SUBSTRATE, POWER MODULE, AND METHOD FOR MANUFACTURING POWER MODULE SUBSTRATE

(75) Inventors: Yoshirou Kuromitsu, Naka-gun (JP); Kazuhiro Akiyama, Naka-gun (JP); Takeshi Kitahara, Gotenba (JP); Hiroshi Tonomura, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 405 days.

(21) Appl. No.: 12/736,813

(22) PCT Filed: May 15, 2009

(86) PCT No.: PCT/JP2009/059089
§ 371 (c)(1), (2), (4) Date: Nov. 12, 2010

(87) PCT Pub. No.: WO2009/139472
PCT Pub. Date: Nov. 19, 2009

(65) Prior Publication Data
US 2011/0067906 A1    Mar. 24, 2011

(30) Foreign Application Priority Data

May 16, 2008 (JP) .................. 2008-129668
May 16, 2008 (JP) .................. 2008-129669
May 16, 2008 (JP) .................. 2008-129670

(51) Int. Cl.
*H05K 1/03* (2006.01)

(52) U.S. Cl.
USPC ........................ 174/256; 174/260

(58) Field of Classification Search
None
See application file for complete search history.

(56) References Cited

U.S. PATENT DOCUMENTS

| | | | |
|---|---|---|---|
| 5,213,877 A * | 5/1993 | Yoshida et al. | 428/209 |
| 6,949,300 B2 * | 9/2005 | Gillispie et al. | 428/654 |
| 7,069,645 B2 * | 7/2006 | Ishikawa et al. | 29/830 |
| 7,128,979 B2 | 10/2006 | Nagase et al. | |
| 7,270,885 B1 * | 9/2007 | Karandikar et al. | 428/446 |
| 7,755,185 B2 * | 7/2010 | Bayerer et al. | 257/714 |
| 8,273,993 B2 * | 9/2012 | Kato et al. | 174/260 |
| 2002/0109152 A1 | 8/2002 | Kobayashi et al. | |
| 2006/0102696 A1 * | 5/2006 | Graham et al. | 228/101 |

FOREIGN PATENT DOCUMENTS

| | | |
|---|---|---|
| CN | 1647267 A | 7/2005 |
| JP | 03-234045 A | 10/1991 |
| JP | 04-363052 A | 12/1992 |

(Continued)

OTHER PUBLICATIONS

Office Action dated Jan. 18, 2012, issued for the Chinese patent application No. 200980117089.7.

(Continued)

*Primary Examiner* — Ishwarbhai Patel
(74) *Attorney, Agent, or Firm* — Edwards Wildman Palmer LLP

(57) ABSTRACT

A power module substrate includes: a ceramics substrate composed of AlN, having a top face; a metal plate composed of pure aluminum and joined to the top face of the ceramics substrate with a brazing filler metal including silicon interposed therebetween; and a high concentration section formed at a joint interface at which the metal plate is joined to the ceramics substrate, having a silicon concentration that is more than five times the silicon concentration in the metal plate.

3 Claims, 15 Drawing Sheets

(56) References Cited

FOREIGN PATENT DOCUMENTS

| | | | |
|---|---|---|---|
| JP | 2002-036424 A | 2/2002 |
| JP | 2002-203942 A | 7/2002 |
| JP | 2003-309210 A | 10/2003 |
| JP | 2006-045040 A | 2/2006 |
| JP | 2008-108993 A | 5/2008 |
| JP | 2009-105166 A | 5/2009 |
| WO | WO-03/090277 A1 | 10/2003 |
| WO | WO 2007/105361 | * | 9/2007 |

OTHER PUBLICATIONS

Office Action mailed Feb. 22, 2011, issued for Japanese Patent Application No. 2008-129668 with its English translation.
Office Action mailed Feb. 22, 2011, issued for Japanese Patent Application No. 2008-129670 with its English translation.
Office Action mailed Mar. 8, 2011 issued for Japanese Patent Application No. 2008-129669 with its English translation.
International Search Report dated Aug. 4, 2009, issued for PCT/JP2009/059089.

* cited by examiner

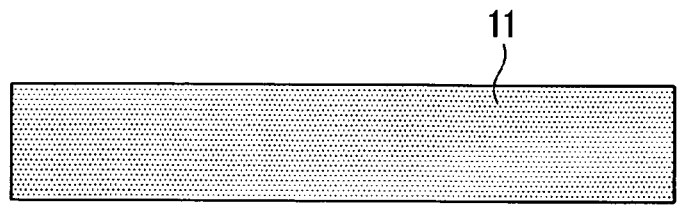
FIG. 4A
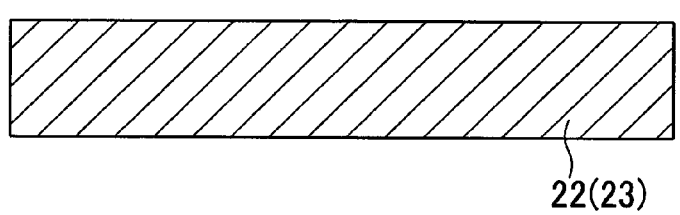
FIG. 4B
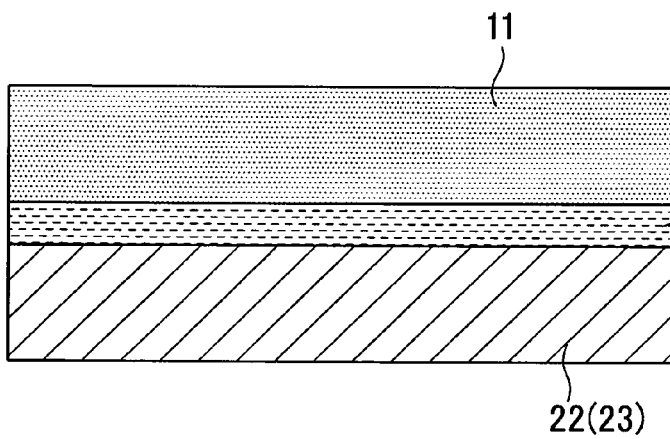
FIG. 4C
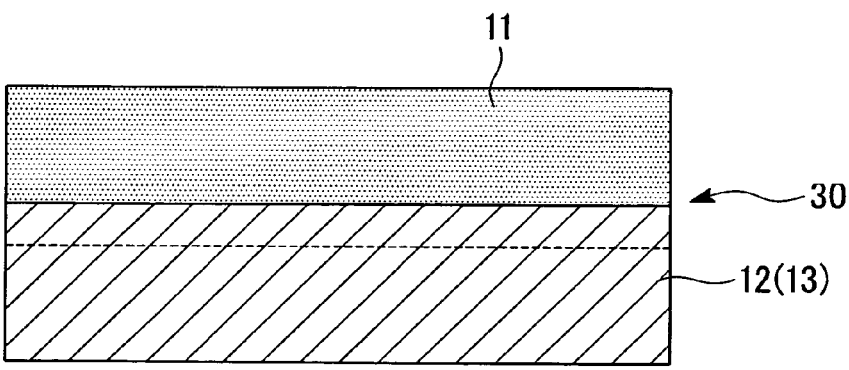

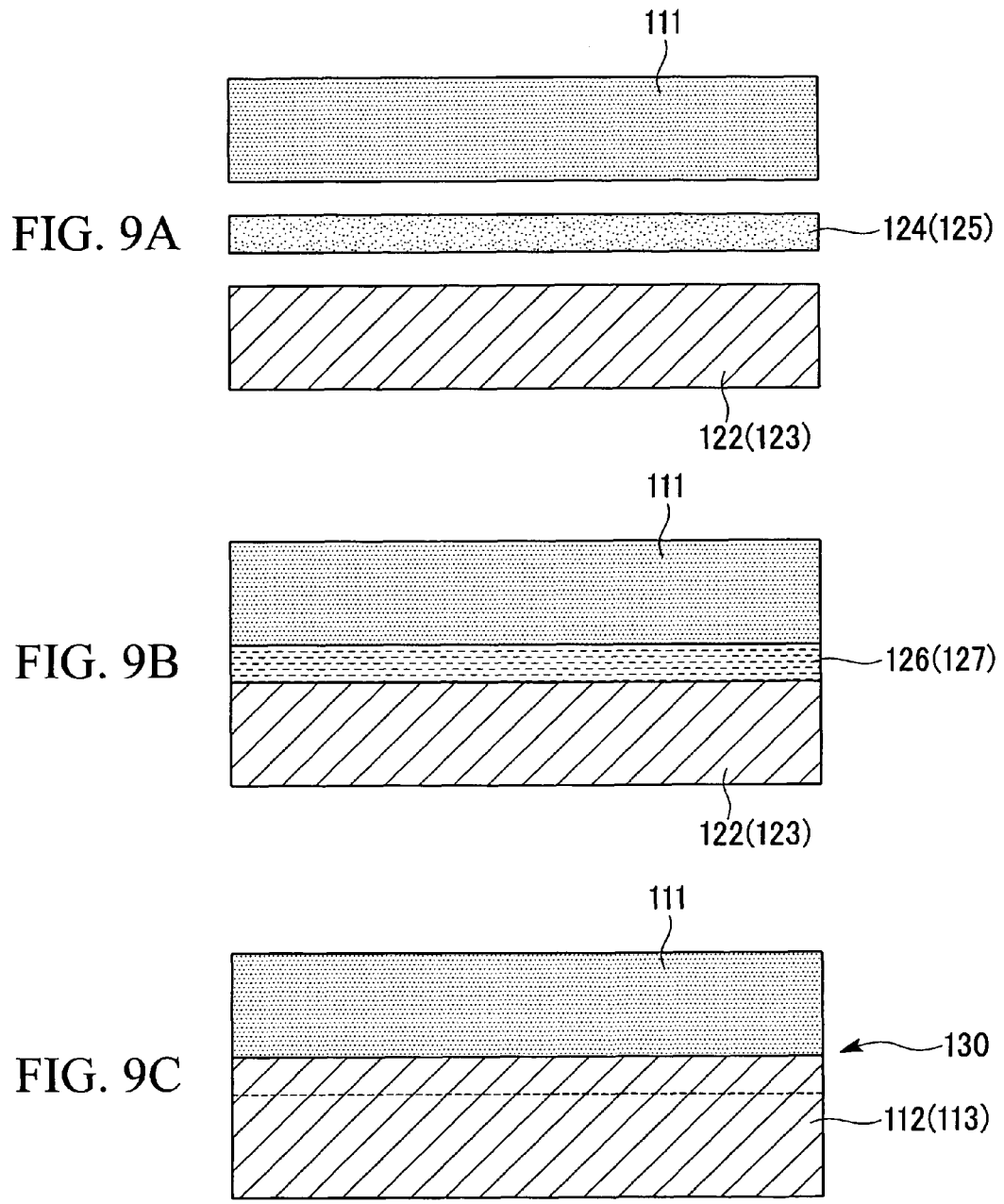

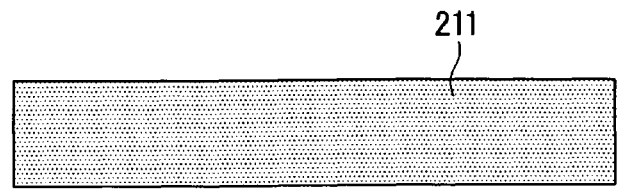
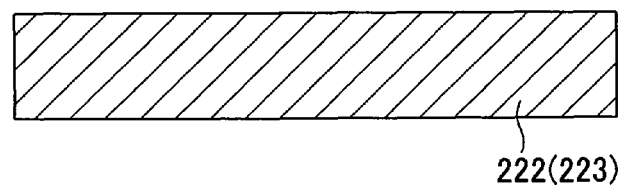
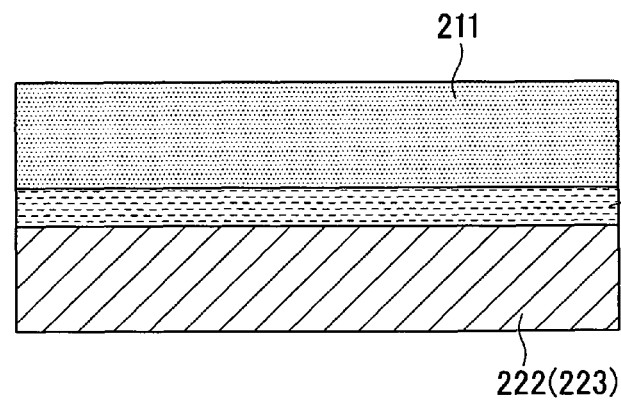
FIG. 14A
FIG. 14B
FIG. 14C

POWER MODULE SUBSTRATE, POWER MODULE, AND METHOD FOR MANUFACTURING POWER MODULE SUBSTRATE

BACKGROUND OF THE INVENTION

1. Field of the Invention

The present invention relates to a power module substrate, which is employed in a semiconductor device controlling a large amount of high voltage electrical current, a power module including the power module substrate, and a method for manufacturing the power module substrate.

This application is based on and claims priority from Japanese Patent Application No. 2008-129668, filed on May 16, 2008, Japanese Patent Application No. 2008-129669, filed on May 16, 2008, and Japanese Patent Application No. 2008-129670, filed on May 16, 2008, the contents of which are incorporated herein by reference.

2. Background Art

Conventionally, in all of semiconductor elements, a power module is used for the power supply.

The amount of heat generated by the power module is relatively high.

Consequently, as a substrate on which the power module is mounted, a power module substrate is used in which a metal plate made of Al (aluminum) is joined to a ceramics substrate with an Al—Si system brazing filler metal interposed therebetween.

In addition, as a ceramics substrate, a substrate composed of AlN (aluminum nitride), a substrate composed of $Si_3N_4$ (silicon nitride), or a substrate composed of $Al_2O_3$ (alumina) is employed.

In addition, the metal plate is formed as a circuit layer, and a semiconductor chip that is a power element is mounted on the metal plate with a solder material interposed therebetween.

In addition, in order to improve the heat radiation efficiency, a structure in which a metal layer is formed by connecting a metal plate composed of Al or the like with a lower face of a ceramics substrate, and the entire power module substrate is joined to a heat radiation plate with the metal layer interposed therebetween has been proposed.

Conventionally, a technique of making the surface roughness of the ceramics substrate less than 0.5 µm to reliably obtain the joint strength between metal plates functioning as the circuit layer and the metal layer, and a ceramics substrate, has been known. Such technique is disclosed in, for example, Japanese Unexamined Patent Application, First Publication No. H3-234045.

However, when the metal plate is joined to the ceramics substrate, even if the roughness surface of the ceramics substrate is simply reduced, sufficient high joint strength is not obtained and there is a disadvantage in that the reliability thereof cannot be improved.

Even if, for example, a honing treatment is performed on the surface of the ceramics substrate by use of $Al_2O_3$ particles in a dry method and the roughness surface Ra thereof is made 0.2 µm, it was found that peeling may occur at an interface thereof in a peeling test.

In addition, even if the roughness surface Ra is made less than or equal to 0.1 µm by use of a polishing method, there is a case where peeling occurs at the interface as the same manner as described above.

Specifically, recently, in power modules, downsizing and reducing of thickness has been required, and the usage environment has become severe.

The power module is used under a usage environment in which, for example, heat stress is repeatedly generated.

In addition, recently, the amount of heat generated in an electronic component has tended to increase, so it is necessary to dispose a power module substrate on a heat radiation plate as described above.

In this case, since the power module substrate is rigidly fixed to the heat radiation plate, a large shear force is generated at a joint interface between the metal plate and the ceramics substrate when the substrate is subjected to thermal cycles.

As a result, improvement of the joint strength and reliability are further required.

SUMMARY OF THE INVENTION

The present invention was conceived in view of the above-described circumstances and it is an object thereof to provide a power module substrate, a power module including the power module substrate, and a method for manufacturing the power module substrate, in which a metal plate is reliably connected with a ceramics substrate and the thermal cycle reliability thereof is high.

In order to solve the foregoing problem and achieve the above-described object, a power module substrate of a first aspect of the present invention includes: a ceramics substrate composed of AlN, having a top face; a metal plate composed of pure aluminum and joined to the top face of the ceramics substrate with a brazing filler metal including silicon interposed therebetween; and a high concentration section formed at a joint interface at which the metal plate is joined to the ceramics substrate, having a silicon concentration that is more than five times the silicon concentration in the metal plate.

In the power module substrate having the structure, the ceramics substrate composed of AlN is joined to the metal plate composed of pure aluminum with a brazing filler metal including silicon, and a high concentration section having a silicon concentration that is more than five times the silicon concentration in the metal plate is formed at the joint interface.

Consequently, the joint strength between the ceramics substrate composed of AlN and the metal plate composed of pure aluminum is improved, which is due to silicon atoms existing at the joint interface.

Here, the silicon concentration in the metal plate means the silicon concentration at the positions that are separated from the joint interface by a predetermined distance (for example, 50 nm or more) in the metal plate.

It is thought that silicon existing at the joint interface at which the metal plate is joined to the ceramics substrate with a high degree of concentration is silicon that is mainly included in the brazing filler metal.

When the metal plate is bonded to the ceramics substrate, silicon is diffused in aluminum (metal plate), the amount thereof decreases at the joint interface, a boundary face portion between the ceramics and aluminum (metal plate) becomes a site of nonuniform nucleation, silicon atoms remain at the boundary face portion, and a high concentration section having a silicon concentration that is more than five times the silicon concentration in the metal plate is formed.

In the power module substrate of the first aspect of the present invention, it is preferable that the oxygen concentration in the high concentration section be greater than the oxygen concentrations in the metal plate and the ceramics substrate, and the thickness of the high concentration section be less than or equal to 4 nm.

It is thought that oxygen existing at the joint interface at which the metal plate is joined to the ceramics substrate with a high degree of concentration is oxygen taken from oxygen existing at the top face of the ceramics substrate and an oxide film formed on the top face of the brazing filler metal.

Here, the oxygen concentration is high at the joint interface, this means the oxide film is sufficiently heated so that it can be reliably removed.

Consequently, it is possible to tightly connect the ceramics substrate to the metal plate.

Furthermore, since the thickness of the high concentration section is less than or equal to 4 nm, cracks are suppressed from being generated in the high concentration section, due to occurrence of heat stress when thermal cycles are loaded.

In the power module substrate of the first aspect of the present invention, it is preferable that the mass ratio of Al, Si, O, and N is Al:Si:O:N=40 to 80 wt %:2 to 10 wt %:20 wt % or less:10 to 40 wt % when the joint interface including the high concentration section is analyzed by an energy dispersive X-ray spectroscopy.

In this case, since the mass ratio of silicon existing at the joint interface including the high concentration section is greater than or equal to 2 wt %, it is possible to reliably improve the junction force between the ceramics substrate and the aluminum (metal plate).

In addition, it is difficult for silicon to exist in the joint interface so that the mass ratio thereof exceeds 10 wt %.

In addition, if the mass ratio of oxygen atom existing at the joint interface including the high concentration section exceeds 20 wt %, the thickness of the portion in which the oxygen concentration is high increases.

Because of this, when thermal cycles are loaded, cracks are generated in the high concentration section, there is a concern that the reliability of the junction is degraded.

For this reason, it is preferable that the oxygen concentration be suppressed so as to be less than or equal to 20 wt %.

In addition, when analyzation is performed by an energy dispersive X-ray spectroscopy, since the diameter of the spot therefor is extremely small, a plurality of points are measured on the joint interface (for example, 10 to 100 points), and the average of the mass ratio of each above-described chemical element is calculated.

In addition, when the measuring is performed, the joint interface between the crystalline grain and the ceramics substrate is only measured without measuring the joint interface between the crystalline grain boundary of the metal plate and the ceramics substrate.

A power module of a second aspect of the present invention includes: the power module substrate of the above-described first aspect; and an electronic component mounted on the power module substrate.

According to the power module having the above-described structure, the joint strength between the ceramics substrate and the metal plate is high, and even if the power module is used under a usage environment in which, for example, heat stress is repeatedly generated, it is possible to significantly improve the reliability thereof.

A method for manufacturing a power module substrate of a third aspect of the present invention includes: preparing a ceramics substrate composed of AlN, having a top face, a metal plate composed of pure aluminum, a brazing filler metal including silicon; stacking the ceramics substrate and the metal plate in layers with the brazing filler metal interposed therebetween; heating the ceramics substrate, the brazing filler metal, and the metal plate which are stacked in layers in a state where a pressure is applied thereon; forming a fusion aluminum layer at a boundary face between the ceramics substrate and the metal plate by melting the brazing filler metal (melting step); solidifying the fusion aluminum layer by cooling down the fusion aluminum layer (solidifying step); and generating a high concentration section having a silicon concentration that is more than five times the silicon concentration in the metal plate, at a joint interface at which the ceramics substrate is joined to the metal plate.

According to the method for manufacturing a power module substrate, in the melting step and the solidifying step, a high concentration section having a silicon concentration that is more than five times the silicon concentration in the metal plate is generated at the joint interface between the ceramics substrate and the metal plate.

Consequently, due to silicon atoms, it is possible to improve the joint strength between the ceramics substrate composed of AlN and the metal plate composed of pure aluminum.

In addition, in the melting step, the brazing filler metal sufficiently melts at the boundary face, and the fusion aluminum layer is thereby formed.

Subsequently, in the solidifying step, since the fusion aluminum layer is solidified, it is possible to tightly connect the ceramics substrate to the metal plate.

In the method for manufacturing a power module substrate of the third aspect of the present invention, it is preferable that silicon be preliminarily adhered to the top face of the ceramics substrate (silicon adhesion step) before stacking the ceramics substrate and the metal plate in layers with the brazing filler metal interposed therebetween.

In addition, it is preferable that silicon be preliminarily adhered to a top face of the metal plate before stacking the ceramics substrate and the metal plate in layers with the brazing filler metal interposed therebetween.

In this case, in the silicon adhesion step, it is possible to reliably cause a chemical element composed of silicon to exist at the joint interface between the ceramics substrate and the metal plate.

Because of this, at the joint interface, it is possible to reliably generate a high concentration section having a silicon concentration that is more than five times the silicon concentration in the metal, and it is possible to improve the joint strength between the ceramics substrate composed of AlN and the metal plate composed of pure aluminum.

In addition, silicon atoms can be adhered to a connection face (top face) of the ceramics substrate by sputtering, evaporation coating, or the like.

In addition, in order to solve the foregoing problem and achieve the above-described object, a power module substrate of a fourth aspect of the present invention includes: a ceramics substrate composed of $Si_3N_4$, having a top face; a metal plate composed of pure aluminum and joined to the top face of the ceramics substrate with a brazing filler metal including silicon interposed therebetween; and a high concentration section formed at a joint interface at which the metal plate is joined to the ceramics substrate, having an oxygen concentration that is greater than an oxygen concentration in the metal plate and in the ceramics substrate, and having a thickness of less than or equal to 4 nm.

In the power module substrate having the structure, the ceramics substrate composed of $Si_3N_4$ is joined to the metal plate composed of pure aluminum with a brazing filler metal including a melting-point lowering element, and the high concentration section having the oxygen concentration that is greater than the oxygen concentrations in the metal plate and the ceramics substrate is formed at the joint interface.

By means of this structure, due to oxygen that is concentrated at the joint interface, the joint strength between the ceramics substrate composed of $Si_3N_4$ and the metal plate composed of pure aluminum is improved.

Furthermore, since the thickness of the high concentration section is less than or equal to 4 nm, cracks are suppressed from being generated in the high concentration section, due to the occurrence of heat stress when thermal cycles are loaded.

Here, the oxygen concentrations in the metal plate and the ceramics substrate mean the oxygen concentrations at the positions that are separated from the joint interface by a predetermined distance (for example, 50 nm or more) in the metal plate or the ceramics substrate.

In addition, it is thought that oxygen existing at the joint interface at which the metal plate is joined to the ceramics substrate with a high degree of concentration is oxygen taken from oxygen existing at the top face of the ceramics substrate and an oxide film formed on the top face of the brazing filler metal.

Here, the oxygen concentration is high at the joint interface, this means the oxide film or the like is sufficiently heated so as to be reliably removed.

Consequently, it is possible to tightly connect the ceramics substrate to the metal plate.

In the power module substrate of the fourth aspect of the present invention, it is preferable that the mass ratio of Al, Si, O, and N be Al:Si:O:N=15 to 50 wt %:25 to 50 wt %:20 wt % or less:10 to 40 wt % when the joint interface is analyzed by an energy dispersive X-ray spectroscopy.

If the mass ratio of oxygen atom existing at the joint interface including the high concentration section exceeds 20 wt %, the thickness of the portion in which the oxygen concentration is high increases.

Because of this, when thermal cycles are loaded, cracks are generated in the high concentration section, there is a concern that the reliability of the junction is degraded.

For this reason, it is preferable that the oxygen concentration be suppressed so as to be less than or equal to 20 wt %.

In addition, when analyzation is performed by an energy dispersive X-ray spectroscopy, since the diameter of the spot therefor is extremely small, a plurality of points are measured on the joint interface (for example, 10 to 100 points), and the average of the mass ratio of each above-described chemical element is calculated.

In addition, when the measuring is performed, the joint interface between the crystalline grain and the ceramics substrate is only measured without measuring the joint interface between the crystalline grain boundary of the metal plate and the ceramics substrate.

In the power module substrate of the fourth aspect of the present invention, it is preferable that a melting-point lowering element be silicon.

Silicon is a chemical element sufficiently lowering the melting point of aluminum.

Because of this, it is possible to make a temperature for connection low, it is possible to prevent the metal plate from melting when the metal plate is bonded to the ceramics substrate, and it is possible to reliably cause the brazing filler metal to melt.

A power module of a fifth aspect of the present invention includes: the power module substrate of the above-described fourth aspect; and an electronic component mounted on the power module substrate.

According to the power module having the above-described structure, the joint strength between the ceramics substrate and the metal plate is high, and even if the power module is used under a usage environment in which, for example, heat stress is repeatedly generated, it is possible to significantly improve the reliability thereof.

A method for manufacturing a power module substrate of a sixth aspect of the present invention, preparing a ceramics substrate composed of $Si_3N_4$, having a top face, a metal plate composed of pure aluminum, a brazing filler metal including a melting-point lowering element; stacking the ceramics substrate and the metal plate in layers with the brazing filler metal interposed therebetween; heating the ceramics substrate, the brazing filler metal, and the metal plate which are stacked in layers in a state where a pressure is applied thereon; forming a fusion aluminum layer at a boundary face between the ceramics substrate and the metal plate by melting the brazing filler metal; solidifying the fusion aluminum layer by cooling down the fusion aluminum layer; and generating a high concentration section formed at a joint interface at which the metal plate is joined to the ceramics substrate, having an oxygen concentration that is greater than an oxygen concentration in the metal plate and in the ceramics substrate, and having a thickness of less than or equal to 4 nm.

In the power module substrate of the sixth aspect of the present invention, it is preferable that silicon be preliminarily adhered to the top face of the ceramics plate before stacking the ceramics substrate and the metal plate in layers with the brazing filler metal interposed therebetween.

In the power module substrate of the sixth aspect of the present invention, it is preferable that silicon be preliminarily adhered to a top face of the metal plate before stacking the ceramics substrate and the metal plate in layers with the brazing filler metal interposed therebetween.

According to the method for manufacturing a power module substrate, in the melting step and the solidifying step, the high concentration section having the oxygen concentration that is greater than the oxygen concentrations in the metal plate and the ceramics substrate is generated at the joint interface between the ceramics substrate and the metal plate, the thickness of the high concentration section being less than or equal to 4 nm.

Consequently, due to oxygen, it is possible to improve the joint strength between the ceramics substrate composed of $Si_3N_4$ and the metal plate composed of pure aluminum.

In addition, in the melting step, the brazing filler metal sufficiently melts at the boundary face, and the fusion aluminum layer is thereby formed.

Subsequently, in the solidifying step, since the fusion aluminum layer is solidified, it is possible to tightly connect the ceramics substrate to the metal plate.

In addition, in order to solve the foregoing problem and achieve the above-described object, a power module substrate of a seventh aspect of the present invention includes: a ceramics substrate composed of $Al_2O_3$, having a top face; a metal plate composed of pure aluminum and joined to the top face of the ceramics substrate with a brazing filler metal including silicon interposed therebetween; and a high concentration section formed at a joint interface at which the metal plate is joined to the ceramics substrate, having a silicon concentration that is more than five times the silicon concentration in the metal plate.

In the power module substrate having the structure, the ceramics substrate composed of $Al_2O_3$ is connected with the metal plate composed of pure aluminum with a brazing filler metal including silicon, and a high concentration section having a silicon concentration that is more than five times the silicon concentration in the metal plate is formed at the joint interface.

Consequently, the joint strength between the ceramics substrate composed of $Al_2O_3$ and the metal plate composed of pure aluminum is improved, which is due to silicon atoms existing at the joint interface.

Here, the silicon concentration in the metal plate means the silicon concentration at the positions that are separated from the joint interface by a predetermined distance (for example, 50 nm or more) in the metal plate.

It is thought that silicon existing at the joint interface at which the metal plate is joined to the ceramics substrate with a high degree of concentration is silicon that is mainly included in the brazing filler metal.

When the metal plate is bonded to the ceramics substrate, silicon is diffused in aluminum (metal plate), the amount thereof decreases at the joint interface, a boundary face portion between the ceramics and aluminum (metal plate) becomes a site of nonuniform nucleation, silicon atoms remain at the boundary face portion, and a high concentration section having a silicon concentration that is more than five times the silicon concentration in the metal plate is formed.

In the power module substrate of the seventh aspect of the present invention, it is preferable that the mass ratio of Al, Si, and O be Al:Si:O=40 to 80 wt %:2 to 10 wt %:50 wt % or less when the joint interface including the high concentration section is analyzed by an energy dispersive X-ray spectroscopy.

In this case, since the mass ratio of silicon existing at the joint interface including the high concentration section is greater than or equal to 2 wt %, it is possible to reliably improve the junction force between the ceramics substrate and the aluminum (metal plate).

In addition, it is difficult for silicon to exist in the joint interface so that the mass ratio thereof exceeds 10 wt %.

In addition, when analyzation is performed by an energy dispersive X-ray spectroscopy, since the diameter of the spot therefor is extremely small, a plurality of points are measured on the joint interface (for example, 10 to 100 points), and the average of the mass ratio of each above-described chemical element is calculated.

In addition, when the measuring is performed, the joint interface between the crystalline grain and the ceramics substrate is only measured without measuring the joint interface between the crystalline grain boundary of the metal plate and the ceramics substrate.

A power module of an eighth aspect of the present invention includes: the power module substrate of the above-described seventh aspect; and an electronic component mounted on the power module substrate.

According to the power module having the above-described structure, the joint strength between the ceramics substrate and the metal plate is high, and even if the power module is used under a usage environment in which, for example, heat stress is repeatedly generated, it is possible to significantly improve the reliability thereof.

A method for manufacturing a power module substrate of a ninth aspect of the present invention includes: preparing a ceramics substrate composed of $Al_2O_3$, having a top face, a metal plate composed of pure aluminum, a brazing filler metal including silicon; stacking the ceramics substrate and the metal plate in layers with the brazing filler metal interposed therebetween; heating the ceramics substrate, the brazing filler metal, and the metal plate which are stacked in layers in a state where a pressure is applied thereon; forming a fusion aluminum layer at a boundary face between the ceramics substrate and the metal plate by melting the brazing filler metal; solidifying the fusion aluminum layer by cooling down the fusion aluminum layer; and generating a high concentration section having a silicon concentration that is more than five times the silicon concentration in the metal plate, at a joint interface at which the ceramics substrate is joined to the metal plate.

According to the method for manufacturing a power module substrate, in the melting step and the solidifying step, a high concentration section having a silicon concentration that is more than five times the silicon concentration in the metal plate is generated at the joint interface between the ceramics substrate and the metal plate.

Consequently, due to silicon atoms, it is possible to improve the joint strength between the ceramics substrate composed of $Al_2O_3$ and the metal plate composed of pure aluminum.

In addition, in the melting step, the brazing filler metal sufficiently melts at the boundary face, and the fusion aluminum layer is thereby formed.

Subsequently, in the solidifying step, since the fusion aluminum layer is solidified, it is possible to tightly connect the ceramics substrate to the metal plate.

In the method for manufacturing a power module substrate of the ninth aspect of the present invention, it is preferable that silicon be preliminarily adhered to the top face of the ceramics substrate (silicon adhesion step) before stacking the ceramics substrate and the metal plate in layers with the brazing filler metal interposed therebetween.

In the method for manufacturing a power module substrate of the ninth aspect of the present invention, it is preferable that silicon be preliminarily adhered to a top face of the metal plate before stacking the ceramics substrate and the metal plate in layers with the brazing filler metal interposed therebetween.

In this case, in the silicon adhesion step, it is possible to reliably cause a chemical element composed of silicon to exist at the joint interface between the ceramics substrate and the metal plate.

Because of this, at the joint interface, it is possible to reliably generate a high concentration section having a silicon concentration that is more than five times the silicon concentration in the metal, and it is possible to improve the joint strength between the ceramics substrate composed of $Al_2O_3$ and the metal plate composed of pure aluminum.

In addition, silicon atoms can be adhered to a connection face (top face) of the ceramics substrate by sputtering, evaporation coating, or the like.

According to the present invention, it is possible to provide a power module substrate, a power module including the power module substrate, and a method for manufacturing the power module substrate, in which a metal plate is reliably connected with a ceramics substrate and the thermal cycle reliability thereof is high.

BRIEF DESCRIPTION OF THE DRAWINGS

FIGS. 4A to 4C are cross-sectional views showing the vicinity of a joint interface between the metal plate and the ceramics substrate shown in FIGS. 3A to 3C.

FIGS. 9A to 9C are cross-sectional views showing the vicinity of a joint interface between the metal plate and the ceramics substrate shown in FIGS. 8A to 8C.

FIGS. 14A to 14C are cross-sectional views showing the vicinity of a joint interface between the metal plate and the ceramics substrate shown in FIGS. 13A to 13C.

DESCRIPTION OF THE PREFERRED EMBODIMENTS

Hereinafter, embodiments of the present invention will be described with reference to drawings.

First Embodiment

Figure 1:
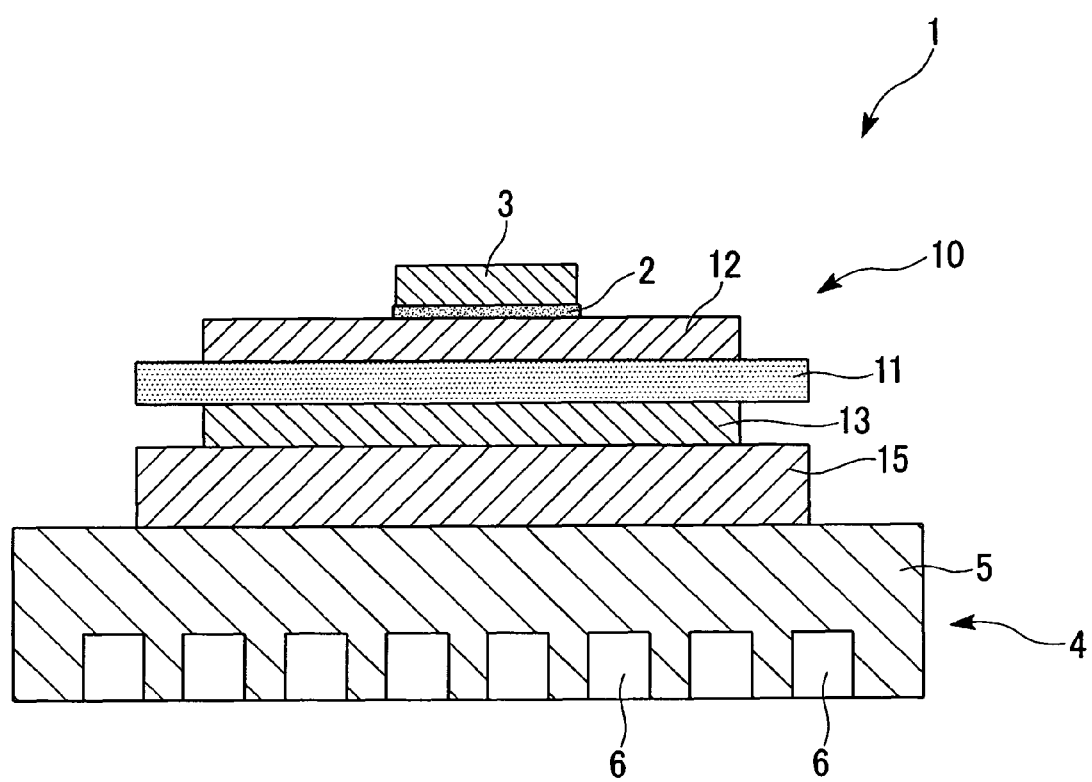
FIG. 1 is a cross-sectional view showing a power module in which a power module substrate of a first embodiment of the present invention is employed.

FIG. 1 shows a power module substrate and a power module of a first embodiment of the present invention.

The power module 1 includes a power module substrate 10 on which a circuit layer 12 is disposed, a semiconductor chip 3 which is bonded to a top face of the circuit layer 12 with a solder layer 2 interposed therebetween, and a heatsink 4.

Here, the solder layer 2 is a solder material, for example, a Sn—Ag system, a Sn—In system, or a Sn—Ag—Cu system.

In addition, in the first embodiment, a Ni plated layer (not shown in the figure) is provided between the circuit layer 12 and the solder layer 2.

The power module substrate 10 includes a ceramics substrate 11, a circuit layer 12 that is disposed on a first face of the ceramics substrate 11 (top face in FIG. 1), and a metal layer 13 that is disposed on a second face of the ceramics substrate 11 (lower face in FIG. 1).

The ceramics substrate 11 is a substrate preventing an electrical connection between the circuit layer 12 and the metal layer 13, and is made of AlN (aluminum nitride) with high level insulation.

In addition, the thickness of the ceramics substrate 11 is in a range of 0.2 to 1.5 mm, and is 0.635 mm in the first embodiment.

By brazing a metal plate 22 having a conductive property on the first face of the ceramics substrate 11, the circuit layer 12 is formed.

In the first embodiment, due to the metal plate 22 constituted of a rolled plate composed of aluminum having a purity of 99.99% or more (a so-called 4N aluminum) being brazed on the ceramics substrate 11, the circuit layer 12 is formed thereon.

Here, in the first embodiment, as a melting-point lowering element, an Al—Si system brazing filler metal including Si is used.

By brazing a metal plate 23 on the second face of the ceramics substrate 11, the metal layer 13 is formed.

In the first embodiment, due to the metal plate 23 constituted of a rolled plate composed of aluminum having a purity of 99.99% or more (a so-called 4N aluminum) being brazed on the ceramics substrate 11, the metal layer 13 is formed in a manner similar to the circuit layer 12.

In the first embodiment, an Al—Si system brazing filler metal is used.

The heatsink 4 is a component for cooling the above-described power module substrate 10, and includes a top panel section 5 connected with the power module substrate 10, and a flow passage 6 through which a cooling medium (for example, cooling water) flows.

The heatsink 4 (top panel section 5) is desirably composed of a material having an excellent thermal conductivity, composed of A6063 (aluminum alloy) in the first embodiment.

In addition, in the first embodiment, a buffer layer 15 composed of aluminum, an aluminum alloy, or a combination of materials including aluminum (for example, AlSiC or the like) is provided between the top panel section 5 of the heatsink 4 and the metal layer 13

Figure 2:
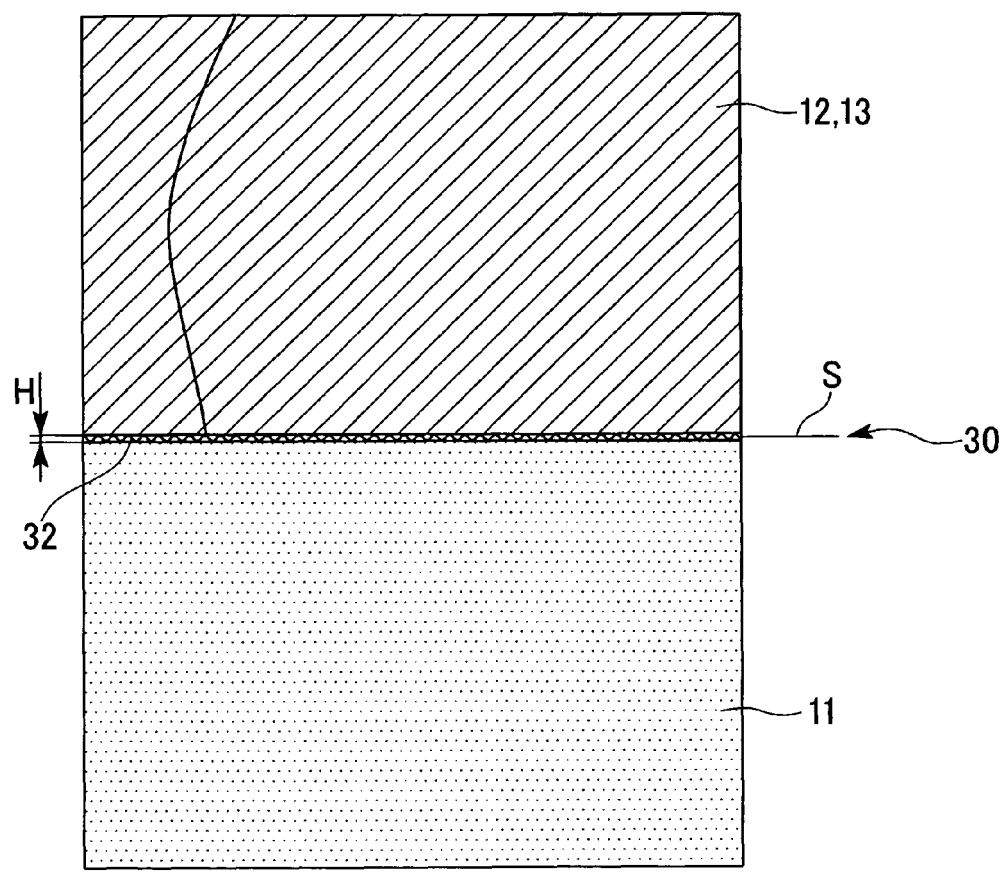
FIG. 2 is a cross-sectional view schematically showing a joint interface between a circuit layer and a metal layer (metal plate) of the power module substrate of the first embodiment of the present invention, and a ceramics substrate.

Consequently, when the joint interface 30 between the ceramics substrate 11 and the circuit layer 12 (metal plate 22) and the joint interface 30 between the ceramics substrate 11 and the metal layer 13 (metal plate 23) are observed using a transmission electron microscope, a high concentration section 32 in which silicon and oxygen are concentrated is formed at the joint interface 30 as shown in FIG. 2.

The silicon concentration in the high concentration section 32 is more than five times the silicon concentration in the circuit layer 12 (metal plate 22) and the metal layer 13 (metal plate 23).

Furthermore, the oxygen concentration in the high concentration section 32 is greater than the oxygen concentration in the circuit layer 12 (metal plate 22) and the metal layer 13 (metal plate 23).

In addition, the thickness H of the high concentration section 32 is less than or equal to 4 nm.

Here, in the joint interface 30 that is observed by a transmission electron microscope, a center between an end portion of the boundary face of the gird image of the circuit layer 12 (metal plate 22) and the metal layer 13 (metal plate 23), and an end portion of the boundary face of the gird image of the ceramics substrate 11, is defined as reference face S as shown in FIG. 2.

In addition, when the joint interface 30 is analyzed by energy dispersive X-ray spectroscopy (EDS), the mass ratio of Al, Si, O, and N is in the range of Al:Si:O:N=40 to 80 wt %:2 to 10 wt %:20 wt % or less:10 to 40 wt %.

In addition, when the analyzation is performed by the EDS, the diameter of the spot therefor is 1 to 4 nm, a plurality of points (for example, 20 points in the first embodiment) is measured at the joint interface 30, and the average of the mass ratio of each above-described chemical element is calculated.

In addition, the joint interface 30 between the crystalline grain of the metal plates 22 and 23 constituting the circuit layer 12 and the metal layer 13, and the ceramics substrate 11 is only measured without measuring the joint interface 30 between the crystalline grain boundary of the metal plates 22 and 23 constituting the circuit layer 12 and the metal layer 13, and the ceramics substrate 11.

The foregoing power module substrate 10 is manufactured as described below.

Figure 3A:
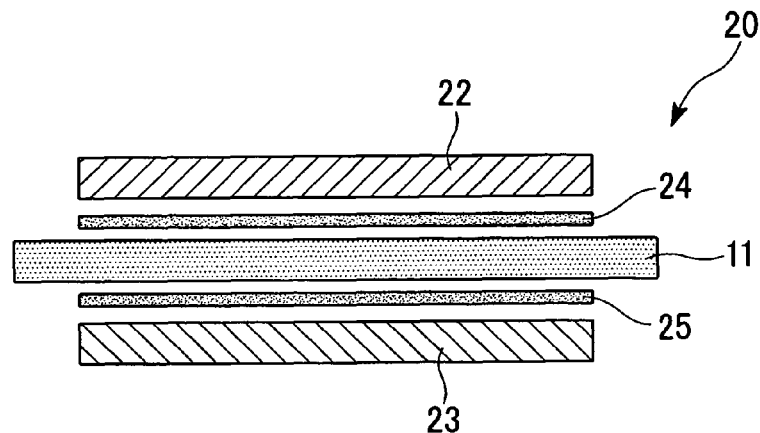
FIGS. 3A to 3C are cross-sectional views showing a method for manufacturing a power module substrate of the first embodiment of the present invention.

As shown in FIGS. 3A and 4A, a ceramics substrate 11 composed of AlN, a metal plate 22 (rolled plate made of 4N aluminum) that becomes circuit layer 12 due to a melting step and solidifying step described later, a brazing filler metal foil 24 having a thickness of 15 to 30 µm (20 µm in the first embodiment), a metal plate 23 (rolled plate made of 4N aluminum) that becomes a metal layer 13 due to a melting step and a solidifying step described later, and a brazing filler metal foil 25 having a thickness of 15 to 30 µm (20 µm in the first embodiment) are prepared.

Figure 3B:
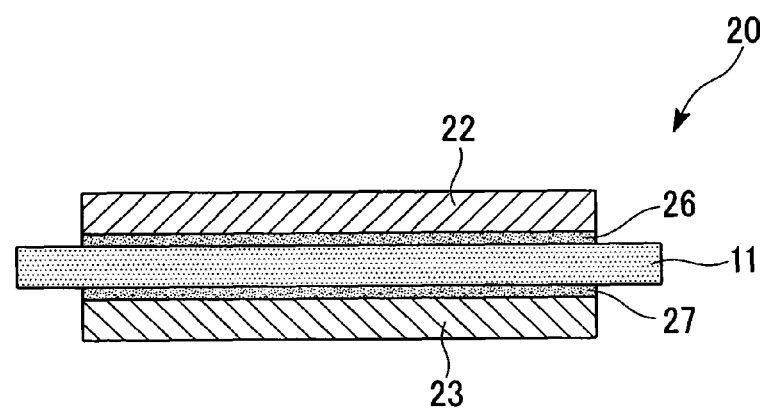

Next, as shown in FIGS. 3B and 4B, the metal plate 22 is stacked on a first face of the ceramics substrate 11 with the brazing filler metal foil 24 interposed therebetween, and the metal plate 23 is stacked on a second face of the ceramics substrate 11 with the brazing filler metal foil 25 interposed therebetween.

Consequently, a layered body 20 is formed.

Figure 3C:
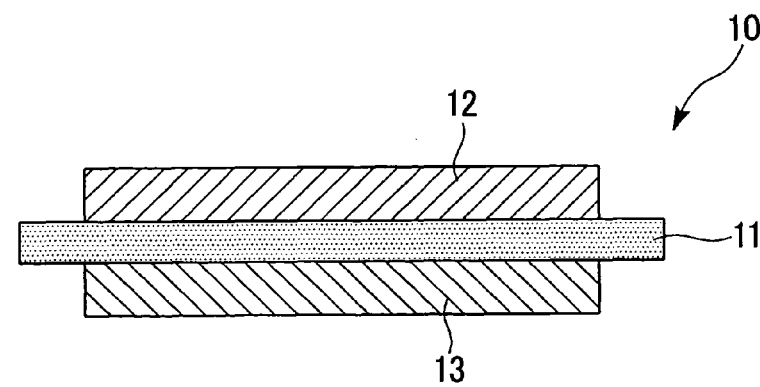

Next, as shown in FIGS. 3C and 4C, the layered body 20 is heated in a state where the layered body 20 is pressed in the stacked direction thereof (pressure is 1 to 3 kgf/cm$^2$) and is set inside of a vacuum furnace, and the brazing filler metal foils 24 and 25 are molten (melting step).

Here, a degree of vacuum is $10^{-3}$ Pa to $10^{-5}$ Pa in the vacuum furnace.

Due to the melting step, as shown in FIG. 4C, a portion of the metal plates 22 and 23 that become, respectively, the circuit layer 12 and the metal layer 13, and the brazing filler metal foils 24 and 25 are molten fusion aluminum layers 26 and 27 formed on a top face of the ceramics substrate 11.

Subsequently, by cooling the layered body 20, the fusion aluminum layers 26 and 27 are solidified (solidifying step).

Due to the melting step and the solidifying step, a high concentration section 32 in which silicon and oxygen are concentrated is formed at the joint interface 30 between the metal plates 22 and 23 that become, respectively, the circuit layer 12 and the metal layer 13, and the ceramics substrate 11.

In the above-described manner, a power module substrate 10 of the first embodiment is manufactured.

In the power module substrate 10 and the power module 1 having the above-described structure in the first embodiment, the metal plates 22 and 23 that become, respectively, the circuit layer 12 and the metal layer 13 are connected with the ceramics substrate 11 by brazing.

The high concentration sections 32 are formed at the joint interface 30 between the metal plate 22 and the ceramics substrate 11 and at the joint interface 30 between the metal plate 23 and the ceramics substrate 11.

The silicon concentration in the high concentration section 32 is more than five times the silicon concentration in the circuit layer 12 (metal plate 22) and the metal layer 13 (metal plate 23), and the oxygen concentration in the high concentration section 32 is greater than the oxygen concentration in the circuit layer 12 (metal plate 22) and the metal layer 13 (metal plate 23).

For this reason, due to the silicon and the oxygen existing at the joint interface 30, it is possible to improve the joint strength between the ceramics substrate 11 and the metal plates 22 and 23.

In addition, the mass ratio of Al, Si, O, and N is Al:Si:O:N=40 to 80 wt %:2 to 10 wt %:20 wt % or less:10 to 40 wt % when the joint interface 30 including the high concentration section 32 is analyzed by energy dispersive X-ray spectroscopy.

In addition, the mass ratio of silicon that exists at the joint interface 30 including the high concentration section 32 is greater than or equal to 2 wt %.

Because of this, it is possible to reliably improve the junction force between the ceramics substrate and the aluminum (metal plate).

In addition, it is difficult for silicon to exist at the joint interface 30 so that the mass ratio thereof exceed 10 wt %.

In addition, since the mass ratio of oxygen atom that exists at the joint interface 30 including the high concentration section 32 is less than or equal to 20 wt %, it is possible to prevent cracks from being generated in the high concentration section 32 when thermal cycles are loaded.

In addition, since an Al—Si system brazing filler metal is used when the metal plates 22 and 23 are joined to the ceramics substrate 11, even if a temperature for connection is relatively low, it is possible to form the fusion aluminum layers 26 and 27 while the brazing filler metal foils 24 and 25 are reliably molten.

As described above, the first embodiment of the present invention is described, the present invention is not limited to the first embodiment, and various modifications may be made without departing from the scope of the invention.

In the first embodiment, the case is described where a rolled plate composed of pure aluminum having a purity of 99.99% is adopted as a metal plate constituting the circuit layer and the metal layer; however, the first embodiment is not limited thereto, and aluminum having a purity of 99% (2N aluminum) may be used.

In addition, in order to reliably scatter silicon atoms at the joint interface, silicon atoms may be attached to the top face of the ceramics substrate before connecting the metal plate and the ceramics substrate (silicon adhesion step).

Furthermore, in the first embodiment, the case is described where the buffer layer composed of aluminum, an aluminum alloy, or a combination of materials including aluminum (for example, AlSiC or the like) is provided between the top panel section of the heatsink and the metal layer; however, it is not necessary to provide the buffer layer.

In addition, the structure in which the heatsink is composed of aluminum is described; however, a structure in which the heatsink is composed of an aluminum alloy, copper, or a copper alloy may be adopted.

Furthermore, a structure which serves as the heatsink and has a flow passage for a cooling medium is described; however, the structure of the heatsink is not limited thereto.

Second Embodiment

Figure 6:
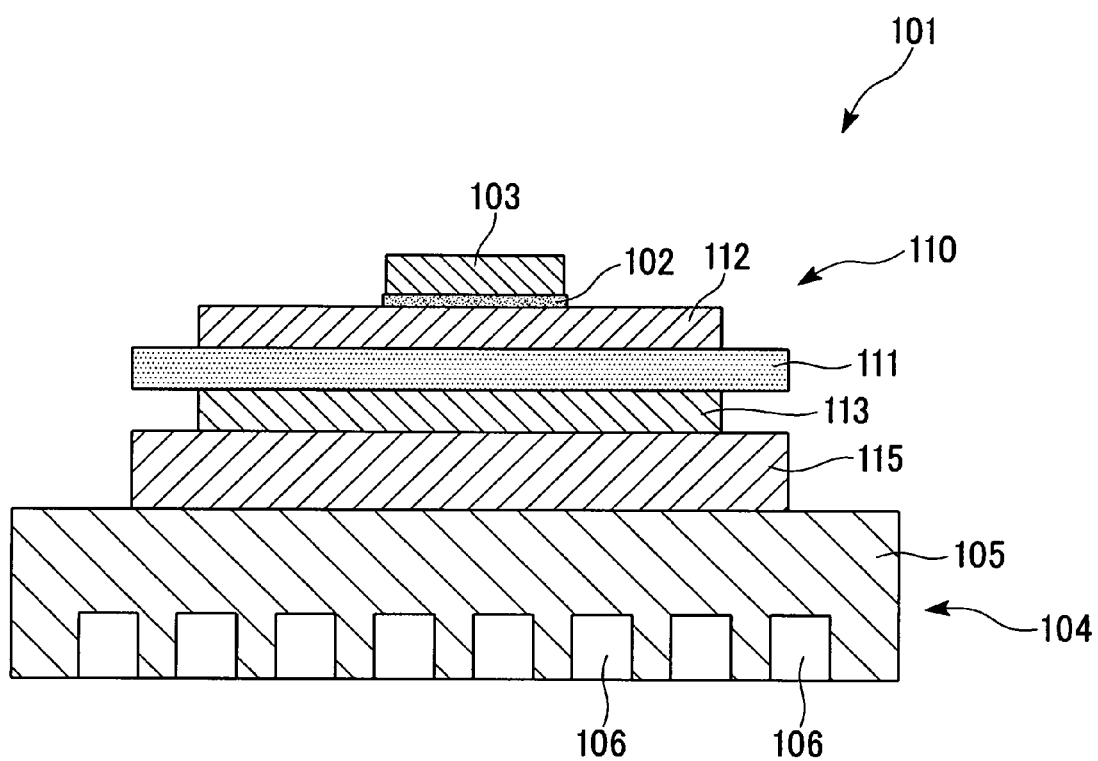
FIG. 6 is a cross-sectional view showing a power module in which a power module substrate of a second embodiment of the present invention is employed.

FIG. 6 shows a power module substrate and a power module of a second embodiment of the present invention.

The power module 101 includes a power module substrate 110 on which a circuit layer 112 is disposed, a semiconductor chip 103 which is bonded to a top face of the circuit layer 112 with a solder layer 102 interposed therebetween, and a heatsink 104.

Here, the solder layer 102 is a solder material, for example, a Sn—Ag system, a Sn—In system, or a Sn—Ag—Cu system.

In addition, in the second embodiment, a Ni plated layer (not shown in the figure) is provided between the circuit layer 112 and the solder layer 102.

The power module substrate 110 includes a ceramics substrate 111, a circuit layer 112 that is disposed on a first face of the ceramics substrate 111 (top face in FIG. 6), a metal layer 113 that is disposed on a second face of the ceramics substrate 111 (lower face in FIG. 6).

The ceramics substrate 111 is a substrate preventing an electrical connection between the circuit layer 112 and the metal layer 113, and is made of $Si_3N_4$ (silicon nitride) with high level insulation.

In addition, the thickness of the ceramics substrate 111 is in a range of 0.2 to 1.5 mm, and is 0.635 mm in the second embodiment.

By brazing a metal plate 122 having a conductive property on the first face of the ceramics substrate 111, the circuit layer 112 is formed.

In the second embodiment, due to the metal plate 122 constituted of a rolled plate composed of aluminum having a purity of 99.99% or more (a so-called 4N aluminum) being brazed on the ceramics substrate 111, the circuit layer 112 is formed thereon.

Here, in the second embodiment, as a melting-point lowering element, an Al—Si system brazing filler metal including Si is used.

By brazing a metal plate 123 on the second face of the ceramics substrate 111, the metal layer 113 is formed.

In the second embodiment, due to the metal plate 123 constituted of a rolled plate composed of aluminum having a purity of 99.99% or more (a so-called 4N aluminum) being brazed on the ceramics substrate 111, the metal layer 113 is formed in a manner similar to the circuit layer 112.

In the second embodiment, an Al—Si system brazing filler metal is used.

The heatsink 104 is a component for cooling the above-described power module substrate 110, and includes a top panel section 105 connected with the power module substrate 110, and a flow passage 106 through which a cooling medium (for example, cooling water) flows.

The heatsink 104 (top panel section 105) is desirably composed of a material having an excellent thermal conductivity, composed of A6063 (aluminum alloy) in the second embodiment.

In addition, in the second embodiment, a buffer layer 115 composed of aluminum, an aluminum alloy, or a combination of materials including aluminum (for example, AlSiC or the like) is provided between the top panel section 105 of the heatsink 104 and the metal layer 113

Figure 7:
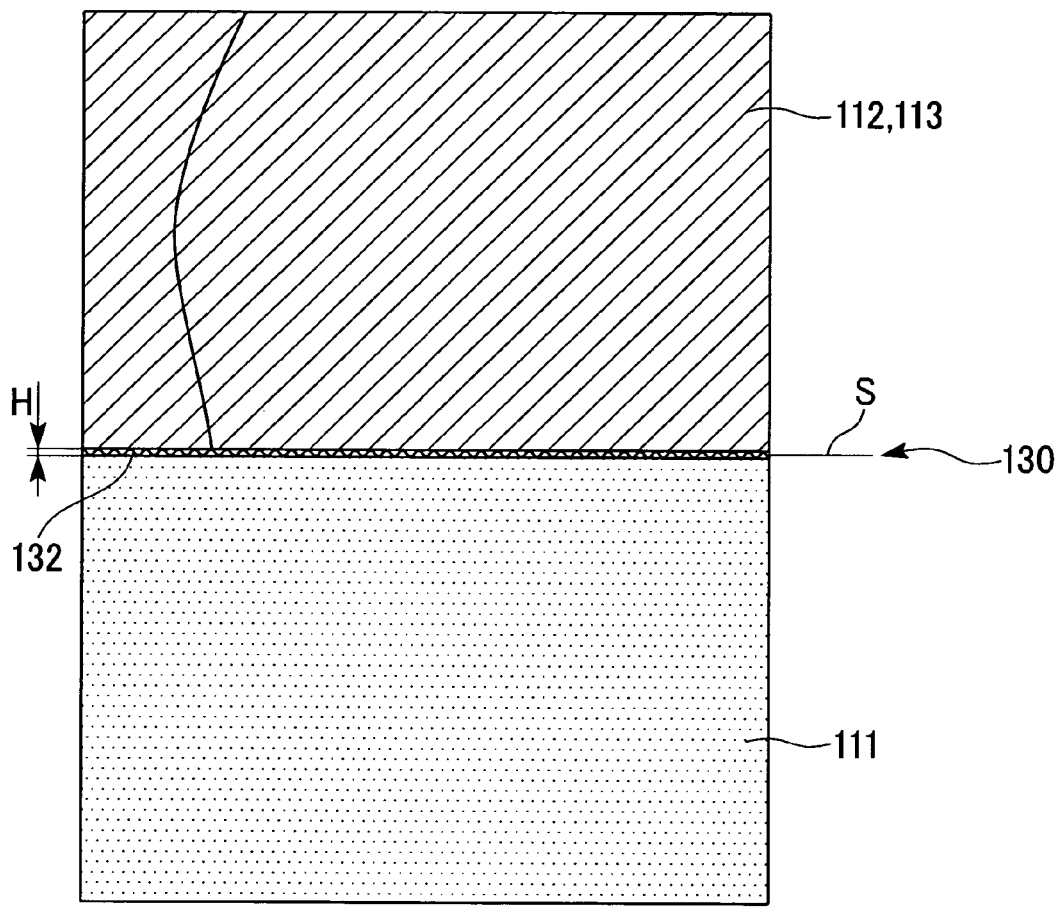
FIG. 7 is a cross-sectional view schematically showing a joint interface between a circuit layer and a metal layer (metal plate) of the power module substrate of the second embodiment of the present invention, and a ceramics substrate.

Consequently, when the joint interface 130 between the ceramics substrate 111 and the circuit layer 112 (metal plate 122) and the joint interface 130 between the ceramics substrate 111 and the metal layer 113 (metal plate 123) are observed using a transmission electron microscope, a high concentration section 132 in which oxygen is concentrated is formed at the joint interface 130 as shown in FIG. 7.

The oxygen concentration in the high concentration section 132 is greater than the oxygen concentration in the circuit layer 112 (metal plate 122) and the metal layer 113 (metal plate 123).

In addition, the thickness H of the high concentration section 132 is less than or equal to 4 nm.

Here, in the joint interface 130 that is observed by a transmission electron microscope, a center between an end portion of the boundary face of the gird image of the circuit layer 112 (metal plate 122) and the metal layer 113 (metal plate 123), and an end portion of the boundary face of the gird image of the ceramics substrate 111, is defined as reference face S as shown in FIG. 7.

In addition, when the joint interface 130 is analyzed by energy dispersive X-ray spectroscopy (EDS), the mass ratio of Al, Si, O, and N is in the range of Al:Si:O:N=15 to 50 wt %:25 to 50 wt %:20 wt % or less:10 to 40 wt %.

In addition, when the analyzation is performed by the EDS, the diameter of the spot therefor is 1 to 4 nm, a plurality of points (for example, 100 points in the second embodiment) is measured at the joint interface 130, and the average of the mass ratio of each above-described chemical element is calculated.

In addition, the joint interface 130 between the crystalline grain of the metal plates 122 and 123 constituting the circuit layer 112 and the metal layer 113, and the ceramics substrate 111 is only measured without measuring the joint interface 130 between the crystalline grain boundary of the metal plates 122 and 123 constituting the circuit layer 112 and the metal layer 113, and the ceramics substrate 111.

The foregoing power module substrate 110 is manufactured as described below.

Figure 8A:
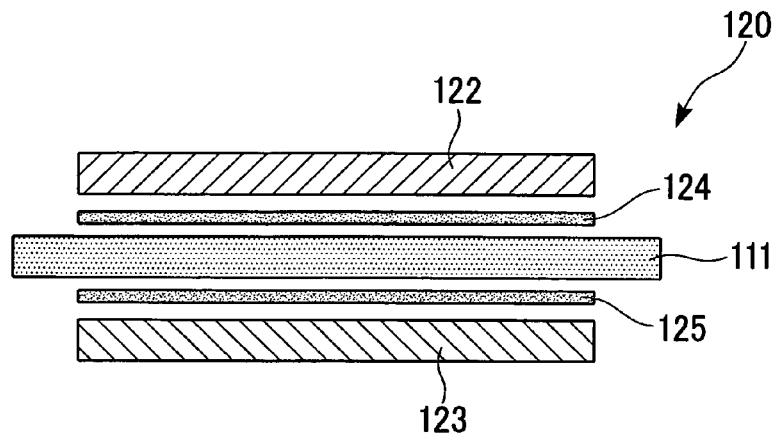
FIGS. 8A to 8C are cross-sectional views showing a method for manufacturing a power module substrate of the second embodiment of the present invention.

As shown in FIGS. 8A and 9A, a ceramics substrate 111 composed of AlN, a metal plate 122 (rolled plate made of 4N aluminum) that becomes circuit layer 112 due to a melting step and solidifying step described later, a brazing filler metal foil 124 having a thickness of 15 to 30 μm (20 μm in the second embodiment), a metal plate 123 (rolled plate made of 4N aluminum) that becomes a metal layer 113 due to a melting step and a solidifying step described later, and a brazing filler metal foil 125 having a thickness of 15 to 30 μm (20 μm in the second embodiment) are prepared.

Figure 8B:
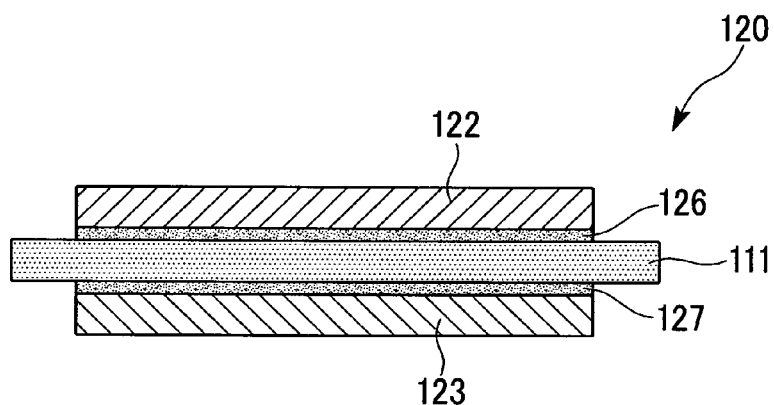

Next, as shown in FIGS. 8B and 9B, the metal plate 122 is stacked on a first face of the ceramics substrate 111 with the brazing filler metal foil 124 interposed therebetween, and the metal plate 123 is stacked on a second face of the ceramics substrate 111 with the brazing filler metal foil 125 interposed therebetween.

Consequently, a layered body 120 is formed.

Figure 8C:
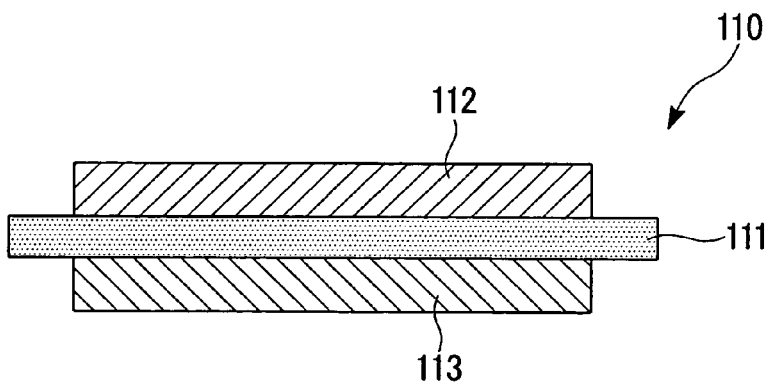

Next, as shown in FIGS. 8C and 9C, the layered body 120 is heated in a state where the layered body 120 is pressed in the stacked direction thereof (pressure is 1 to 3 kgf/cm²) and is set inside of a vacuum furnace, and the brazing filler metal foils 124 and 125 are molten (melting step).

Here, a degree of vacuum is $10^{-3}$ Pa to $10^{-5}$ Pa in the vacuum furnace.

Due to the melting step, as shown in FIG. 9C, a portion of the metal plates 122 and 123 that become, respectively, the circuit layer 112 and the metal layer 113, and the brazing filler metal foils 124 and 125 are molten fusion aluminum layers 126 and 127 formed on a top face of the ceramics substrate 111.

Subsequently, by cooling the layered body 120, the fusion aluminum layers 126 and 127 are solidified (solidifying step).

Due to the melting step and the solidifying step, a high concentration section 132 having the oxygen concentration greater than the oxygen concentration in the metal plates 122 and 123 constituting, respectively, the circuit layer 112 and the metal layer 113 is generated in the joint interface 130.

In addition, the thickness H of the high concentration section 132 is less than or equal to 4 nm.

In the above-described manner, a power module substrate 110 of the second embodiment is manufactured.

In the power module substrate 110 and the power module 101 having the above-described structure in the second embodiment, the metal plates 122 and 123 that become, respectively, the circuit layer 112 and the metal layer 113 are connected with the ceramics substrate 111 by brazing.

The high concentration sections 132 are generated in the joint interface 130 between the metal plate 122 and the ceramics substrate 111 and in the joint interface 130 between the metal plate 123 and the ceramics substrate 111.

The oxygen concentration of the high concentration section 132 is greater than the oxygen concentration in the metal plates 122 and 123 constituting the circuit layer 112 and the metal layer 113.

Consequently, due to oxygen, it is possible to improve the joint strength between the ceramics substrate 111 and the metal plates 122 and 123.

In addition, since the thickness of the high concentration section 132 is less than or equal to 4 nm, it is possible to suppress cracks from being generated in the high concentration section 132, the cracks being caused by stress when thermal cycles are loaded.

In addition, the mass ratio of Al, Si, O, and N is Al:Si:O:N=15 to 50 wt %:25 to 50 wt %:20 wt % or less:10 to 40 wt % when the joint interface 130 including the high concentration section 132 is analyzed by energy dispersive X-ray spectroscopy.

Because of this, when thermal cycles are loaded, it is possible to prevent cracks from being generated in the high concentration section 132 when thermal cycles are loaded.

In addition, since an Al—Si system brazing filler metal including includes Si that serves as a melting-point lowering element is used when the metal plates 122 and 123 are joined to the ceramics substrate 111, even if a temperature for connection is relatively low, it is possible to form the fusion aluminum layers 126 and 127 while the brazing filler metal foils 124 and 125 are reliably molten.

As described above, the second embodiment of the present invention is described, the present invention is not limited to the second embodiment, and various modifications may be made without departing from the scope of the invention.

The case is described where, for example, a brazing filler metal composed of Al—Si system is used as a brazing filler metal; however, it is not limited thereto, a brazing filler metal having a melting-point lowering element as well as an Al—Ge system, an Al—Cu system, an Al—Mg system, or the like may be employed.

In addition, in the second embodiment, the case is described where the buffer layer composed of aluminum, an aluminum alloy, or a combination of materials including aluminum (for example, AlSiC or the like) is provided between the top panel section of the heatsink and the metal layer; however, it is not necessary to provide the buffer layer.

Furthermore, in the second embodiment, the case is described where a rolled plate composed of pure aluminum having a purity of 99.99% is adopted as a metal plate constituting the circuit layer and the metal layer; however, the first embodiment is not limited thereto, and aluminum having a purity of 99% (2N aluminum) may be used.

In addition, the structure in which the heatsink is composed of aluminum is described; however, a structure in which the heatsink is composed of an aluminum alloy, copper, or a copper alloy may be adopted.

Furthermore, a structure which serves as the heatsink and has a flow passage for a cooling medium is described; however, the structure of the heatsink is not limited thereto.

Third Embodiment

Figure 11:
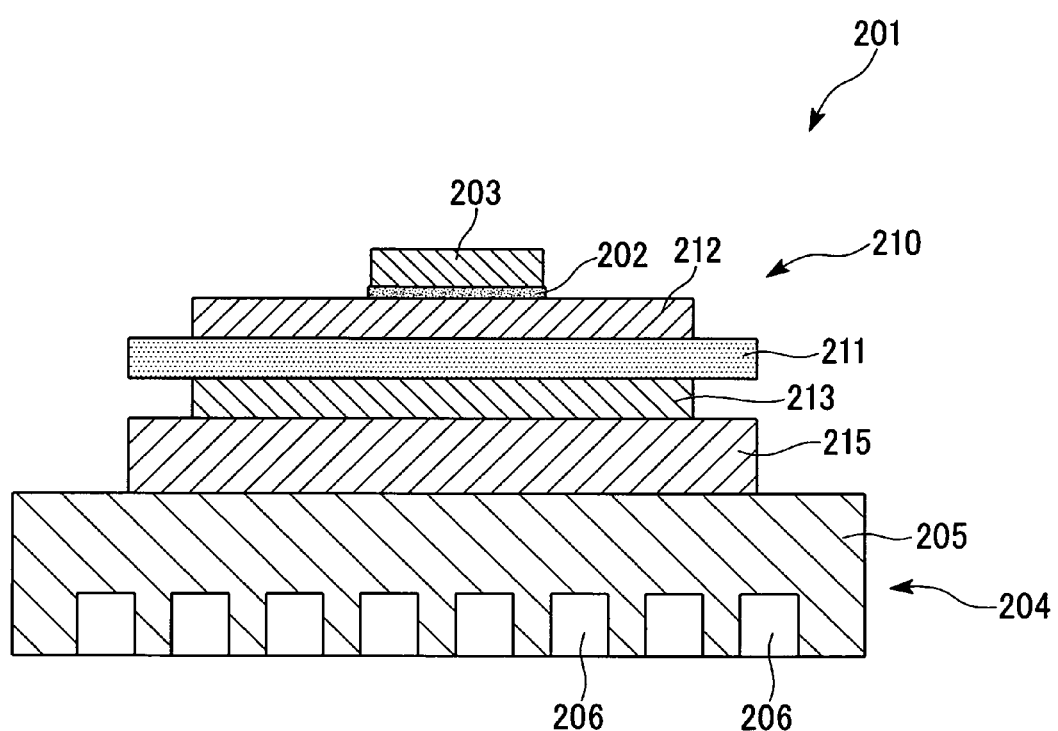
FIG. 11 is a cross-sectional view showing a power module in which a power module substrate of a third embodiment of the present invention is employed.

FIG. 11 shows a power module substrate and a power module of a third embodiment of the present invention.

The power module 201 includes a power module substrate 210 on which a circuit layer 212 is disposed, a semiconductor chip 203 which is bonded to a top face of the circuit layer 212 with a solder layer 202 interposed therebetween, and a heatsink 204.

Here, the solder layer 202 is a solder material, for example, a Sn—Ag system, a Sn—In system, or a Sn—Ag—Cu system.

In addition, in the third embodiment, a Ni plated layer (not shown in the figure) is provided between the circuit layer 212 and the solder layer 202.

The power module substrate 210 includes a ceramics substrate 211, a circuit layer 212 that is disposed on a first face of the ceramics substrate 211 (top face in FIG. 11), and a metal layer 213 that is disposed on a second face of the ceramics substrate 211 (lower face in FIG. 11).

The ceramics substrate 211 is a substrate preventing an electrical connection between the circuit layer 212 and the metal layer 213, and is made of $Al_2O_3$ (alumina) with high level insulation.

In addition, the thickness of the ceramics substrate 211 is in a range of 0.2 to 1.5 mm, and is 0.635 mm in the third embodiment.

By brazing a metal plate 222 having a conductive property on the first face of the ceramics substrate 211, the circuit layer 212 is formed.

In the third embodiment, due to the metal plate 222 constituted of a rolled plate composed of aluminum having a purity of 99.99% or more (a so-called 4N aluminum) being brazed on the ceramics substrate 211, the circuit layer 212 is formed thereon.

Here, in the third embodiment, as a melting-point lowering element, an Al—Si system brazing filler metal including Si is used.

By brazing a metal plate 223 on the second face of the ceramics substrate 211, the metal layer 213 is formed.

In the third embodiment, due to the metal plate 223 constituted of a rolled plate composed of aluminum having a purity of 99.99% or more (a so-called 4N aluminum) being brazed on the ceramics substrate 211, the metal layer 213 is formed in a manner similar to the circuit layer 212.

In the third embodiment, an Al—Si system brazing filler metal is used.

The heatsink 204 is a component for cooling the above-described power module substrate 210, and includes a top panel section 205 connected with the power module substrate 210, and a flow passage 206 through which a cooling medium (for example, cooling water) flows.

The heatsink 204 (top panel section 205) is desirably composed of a material having an excellent thermal conductivity, composed of A6063 (aluminum alloy) in the third embodiment.

In addition, in the third embodiment, a buffer layer 215 composed of aluminum, an aluminum alloy, or a combination of materials including aluminum (for example, AlSiC or the like) is provided between the top panel section 205 of the heatsink 204 and the metal layer 213

Figure 12:
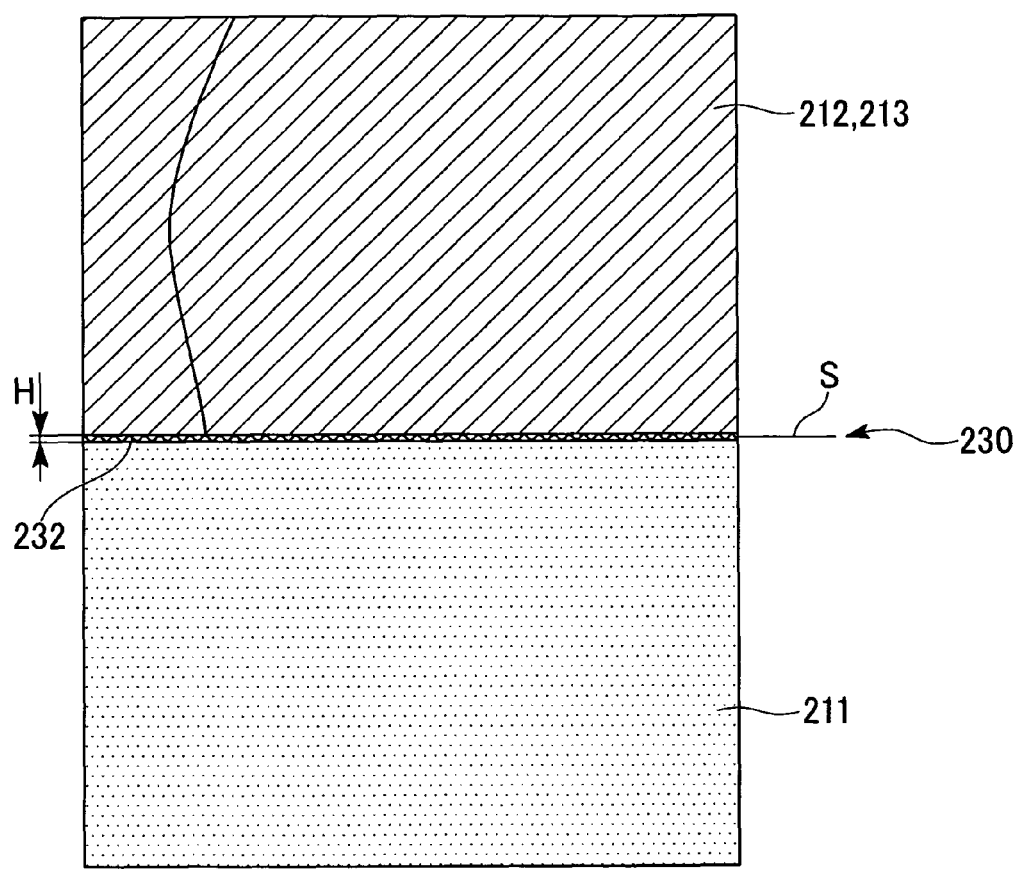
FIG. 12 is a cross-sectional view schematically showing a joint interface between a circuit layer and a metal layer (metal plate) of the power module substrate of the third embodiment of the present invention, and a ceramics substrate.

Consequently, when the joint interface 230 between the ceramics substrate 211 and the circuit layer 212 (metal plate 222) and the joint interface 230 between the ceramics substrate 211 and the metal layer 213 (metal plate 223) are observed using a transmission electron microscope, a high concentration section 232 in which silicon is concentrated is formed at the joint interface 230 as shown in FIG. 12.

The silicon concentration in the high concentration section 232 is more than five times the silicon concentration in the circuit layer 212 (metal plate 222) and the metal layer 213 (metal plate 223).

In addition, the thickness H of the high concentration section 232 is less than or equal to 4 nm.

Here, in the joint interface 230 that is observed by a transmission electron microscope, a center between an end portion of the boundary face of the gird image of the circuit layer 212 (metal plate 222) and the metal layer 213 (metal plate 223), and an end portion of the boundary face of the gird image of the ceramics substrate 211, is defined as reference face S as shown in FIG. 12.

In addition, when the joint interface 230 is analyzed by energy dispersive X-ray spectroscopy (EDS), the mass ratio of Al, Si, and O is in the range of Al:Si:O=40 to 80 wt %:2 to 10 wt %:50 wt % or less.

In addition, when the analyzation is performed by the EDS, the diameter of the spot therefor is 1 to 4 nm, a plurality of points (for example, 20 points in the third embodiment) is measured at the joint interface 230, and the average of the mass ratio of each above-described chemical element is calculated.

In addition, the joint interface 230 between the crystalline grain of the metal plates 222 and 223 constituting the circuit layer 212 and the metal layer 213, and the ceramics substrate 211 is only measured without measuring the joint interface 230 between the crystalline grain boundary of the metal plates 222 and 223 constituting the circuit layer 212 and the metal layer 213, and the ceramics substrate 211.

The foregoing power module substrate 210 is manufactured as described below.

Figure 13A:
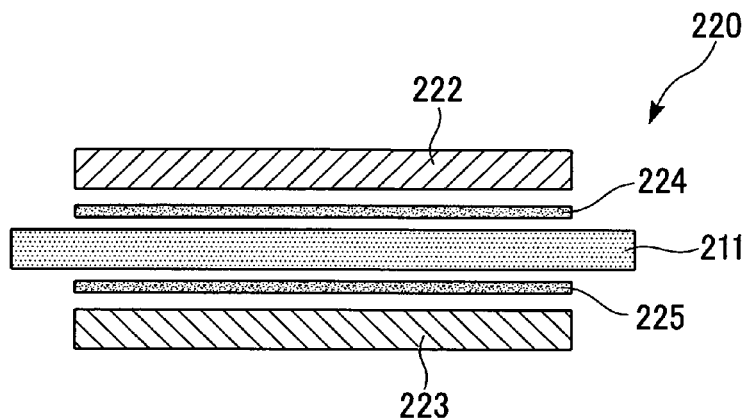
FIGS. 13A to 13C are cross-sectional views showing a method for manufacturing a power module substrate of the third embodiment of the present invention.

As shown in FIGS. 13A and 14A, a ceramics substrate 211 composed of $Al_2O_3$, a metal plate 222 (rolled plate made of 4N aluminum) that becomes circuit layer 212 due to a melting step and solidifying step described later, a brazing filler metal foil 224 having a thickness of 15 to 30 μm (20 μm in the third embodiment), a metal plate 223 (rolled plate made of 4N aluminum) that becomes a metal layer 213 due to a melting step and a solidifying step described later, and a brazing filler metal foil 225 having a thickness of 15 to 30 μm (20 μm in the third embodiment) are prepared.

Figure 13B:
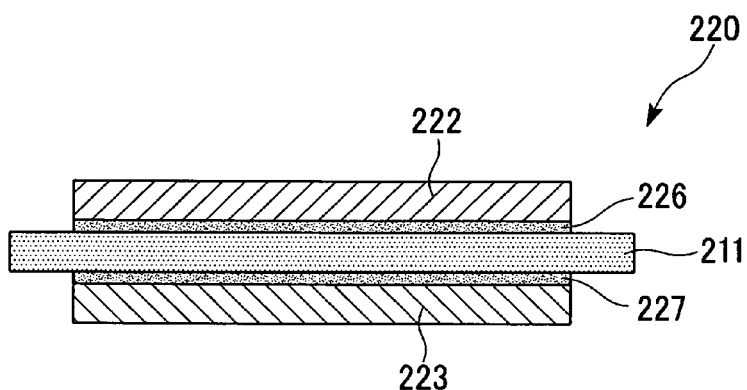

Next, as shown in FIGS. 13B and 14B, the metal plate 222 is stacked on a first face of the ceramics substrate 211 with the brazing filler metal foil 224 interposed therebetween, and the metal plate 223 is stacked on a second face of the ceramics substrate 211 with the brazing filler metal foil 225 interposed therebetween.

Consequently, a layered body 220 is formed.

Figure 13C:
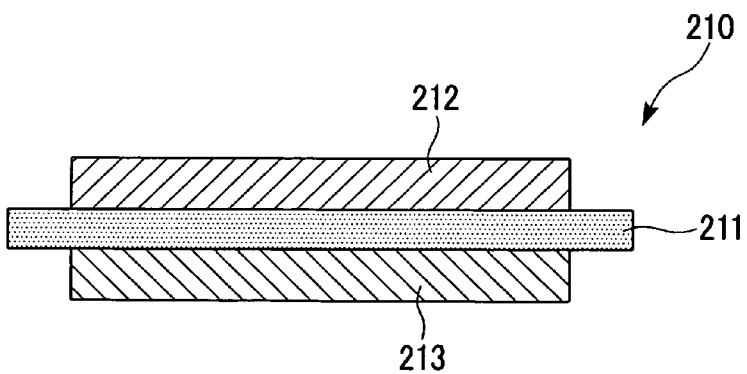

Next, as shown in FIGS. 13C and 14C, the layered body 220 is heated in a state where the layered body 220 is pressed in the stacked direction thereof (pressure is 1 to 3 $kgf/cm^2$) and is set inside of a vacuum furnace, and the brazing filler metal foils 224 and 225 are molten (melting step).

Here, a degree of vacuum is $10^{-3}$ Pa to $10^{-5}$ Pa in the vacuum furnace.

Due to the melting step, as shown in FIG. 14C, a portion of the metal plates 222 and 223 that become, respectively, the circuit layer 212 and the metal layer 213, and the brazing filler metal foils 224 and 225 are molten fusion aluminum layers 226 and 227 formed on a top face of the ceramics substrate 211.

Subsequently, by cooling the layered body 220, the fusion aluminum layers 226 and 227 are solidified (solidifying step).

Due to the melting step and the solidifying step, a high concentration section 232 in which silicon is concentrated is formed at the joint interface 230 between the metal plates 222 and 223 that become, respectively, the circuit layer 212 and the metal layer 213, and the ceramics substrate 211.

In the above-described manner, a power module substrate 210 of the third embodiment is manufactured.

In the power module substrate 210 and the power module 201 having the above-described structure in the third embodiment, the metal plates 222 and 223 that become, respectively, the circuit layer 212 and the metal layer 213 are connected with the ceramics substrate 211 by brazing.

The high concentration sections 232 are formed at the joint interface 230 between the metal plate 222 and the ceramics substrate 211 and at the joint interface 230 between the metal plate 223 and the ceramics substrate 211.

The silicon concentration in the high concentration section 232 is more than five times the silicon concentration in the circuit layer 212 (metal plate 222) and the metal layer 213 (metal plate 223).

For this reason, due to the silicon existing at the joint interface 230, it is possible to improve the joint strength between the ceramics substrate 211 and the metal plates 222 and 223.

In addition, Al:Si:O is 40 to 80 wt %:2 to 10 wt %:50 wt % or less when the joint interface 230 is analyzed by energy dispersive X-ray spectroscopy.

That is, the mass ratio of silicon atoms 231 existing at the joint interface 230 is less than or equal to 10 wt %.

In addition, the mass ratio of silicon that exists at the joint interface 230 including the high concentration section 232 is greater than or equal to 2 wt %.

Because of this, it is possible to reliably improve the junction force between the ceramics substrate and the aluminum (metal plate).

In addition, it is difficult for silicon to exist at the joint interface 230 so that the mass ratio thereof exceed 10 wt %.

In addition, since an Al—Si system brazing filler metal is used when the metal plates 222 and 223 are joined to the ceramics substrate 211, even if a temperature for connection is relatively low, it is possible to form the fusion aluminum layers 226 and 227 while the brazing filler metal foils 224 and 225 are reliably molten.

As described above, the third embodiment of the present invention is described, the present invention is not limited to the third embodiment, and various modifications may be made without departing from the scope of the invention.

In the third embodiment, the case is described where a rolled plate composed of pure aluminum having a purity of 99.99% is adopted as a metal plate constituting the circuit layer and the metal layer; however, the third embodiment is not limited thereto, and aluminum having a purity of 99% (2N aluminum) may be used.

In addition, in the third embodiment, the case is described where the buffer layer composed of aluminum, an aluminum alloy, or a combination of materials including aluminum (for example, AlSiC or the like) is provided between the top panel section of the heatsink and the metal layer; however, it is not necessary to provide the buffer layer.

In addition, in order to reliably scatter silicon atoms at the joint interface, silicon atoms may be attached to the top face of the ceramics substrate or to the top face of the metal plate before connecting the metal plate and the ceramics substrate (silicon adhesion step).

In addition, the structure in which the heatsink is composed of aluminum is described; however, a structure in which the heatsink is composed of an aluminum alloy, copper, or a copper alloy may be adopted.

Furthermore, a structure which serves as the heatsink and has a flow passage for a cooling medium is described; however, the structure of the heatsink is not limited thereto.

EXAMPLES

First Example

A comparison experiment which is performed in order to confirm availability of the present invention will be described.

A first example described below corresponds to the above-described first embodiment.

Figure 5:
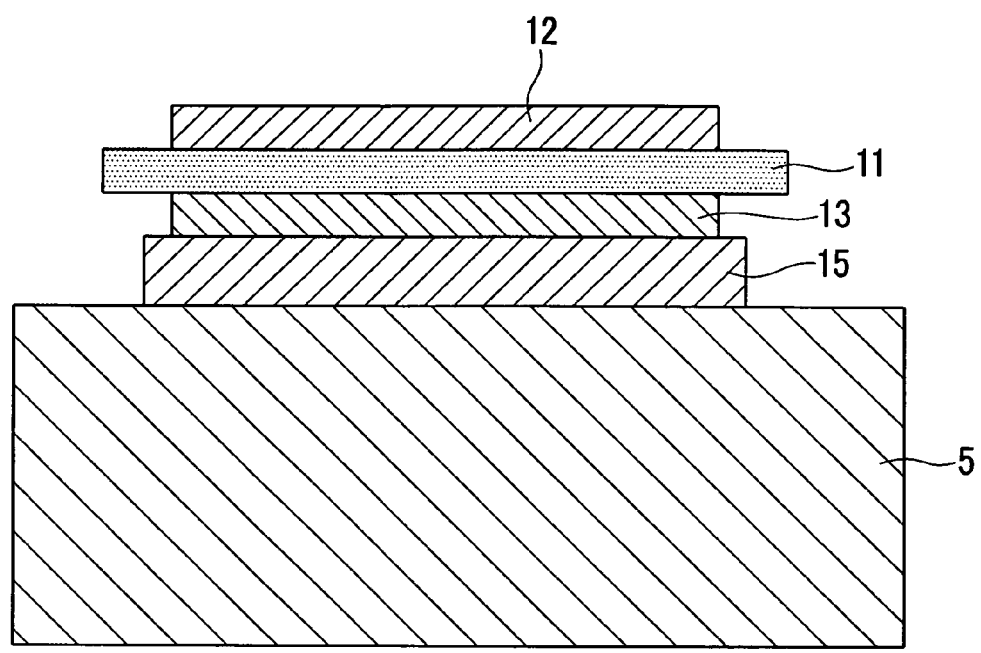
FIG. 5 is a cross-sectional view showing a power module substrate used in a comparison experiment.

As shown in FIG. 5, in comparative examples 1 to 3 and the examples 1 to 3, experiments were performed by use of the same test pieces of power module substrates.

Specifically, the power module substrates have the ceramics substrate 11 composed of AlN having a thickness of 0.635 mm, the circuit layer 12 composed of 4N aluminum having a thickness of 0.6 mm, the metal layer 13 composed of 4N aluminum having a thickness of 0.6 mm, the top panel section 5 composed of an aluminum alloy (A6063) having a thickness of 5 mm, and the buffer layer 15 composed of 4N aluminum having a thickness of 1.0 mm.

Observation of a joint interface and evaluation of joint strength were performed by use of the test pieces.

When observing the joint interface, a field-emission transmission electron microscope, JEM-2010F produced by JEOL Ltd., was used.

An acceleration voltage was set to 200 kV, and observation of the joint interface was performed.

The test pieces for observation were produced in the following manner.

Firstly, test pieces in which a metal plate is connected to a ceramics substrate were prepared, the test pieces were sliced by a diamond cutter, and a mechanical polishing of the test pieces was performed by use of a diamond grind stone so that the thicknesses of the test pieces became approximately substantially 30 μm.

Subsequently, an ion milling was performed with argon ions (5 kV, 30 μA), and the test pieces for observation including a portion having a thickness of 0.1 μm or less, through which an electron beam can transmit, were produced.

In the observation of the joint interface, 20 points of thicknesses of a high concentration section which was formed on the joint interface were measured, and the average value of the thicknesses was calculated.

The measurement results of average thickness of the high concentration section are shown in Table 1.

In addition, an energy dispersive X-ray spectroscope, a Voyager produced by Noran Instruments Inc., was used, and the joint interface between the metal plate and the ceramics substrate was analyzed.

The assay result is shown in Table 1.

Here, as a result of analyzing the positions that are separated from the joint interface by 50 nm in the metal plate in a similar manner as described above, the silicon concentration (the silicon concentration in the metal plate) was 0.2 to 0.3 wt %.

In addition, in the above-described observation by TEM and analyzing by EDS, a two-axis tilt holder for analysis was used.

In evaluation of the joint strength, junction rates were compared to each other after 3000 thermal cycles (−45° C. to 125° C.) were reiterated.

The evaluation results are shown in Table 1.

TABLE 1

| | AMOUNT OF SILICON | AMOUNT OF OXYGEN | AVERAGE THICKNESS OF HIGH CONCENTRATION SECTION | JUNCTION RATE (AFTER 3000 TIMES OF CYCLES) |
|---|---|---|---|---|
| EXAMPLE 1 | 3.4 wt % | 13.8 wt % | 1.7 nm | 91.3% |
| EXAMPLE 2 | 4.9 wt % | 10.2 wt % | 0.8 nm | 93.0% |
| EXAMPLE 3 | 5.5 wt % | 9.1 wt % | 0.0 nm | 95.2% |
| COMPARATIVE EXAMPLE 1 | 0.3 wt % | 32.3 wt % | 5.6 nm | 68.8% |
| COMPARATIVE EXAMPLE 2 | 0.7 wt % | 29.7 wt % | 5.3 nm | 74.9% |
| COMPARATIVE EXAMPLE 3 | 0.9 wt % | 26.6 wt % | 4.8 nm | 79.2% |

In comparative examples 1 to 3 in which silicon did not exist in the joint interface with a high degree of concentration, it was confirmed that the junction rate after thermal cycle test was low and the thermal cycle reliability was degraded.

On the other hand, in the examples 1 to 3 in which silicon exists in the joint interface with the silicon concentration that is more than five times that of the metal plate, it was confirmed that the junction rate is 90% or more even after 3000 thermal cycles, and the thermal cycle reliability was improved.

In addition, in the example 3, the thickness of the high concentration section is 0.0 nm, all of 20 points of measurement values were 0.0 nm as a result of observation using a transmission electron microscope.

In addition, in the above-described manner, even if the high concentration section was not clearly observed, as a result of analyzing the joint interface with the EDS, the silicon concentration was 5.5 wt % which is more than five times the silicon concentration in the metal plate (0.2 to 0.3 wt %), and it was obvious that the high concentration section exists.

Second Example

A comparison experiment which is performed in order to confirm availability of the present invention will be described.

A second example described below corresponds to the above-described second embodiment.

Figure 10:
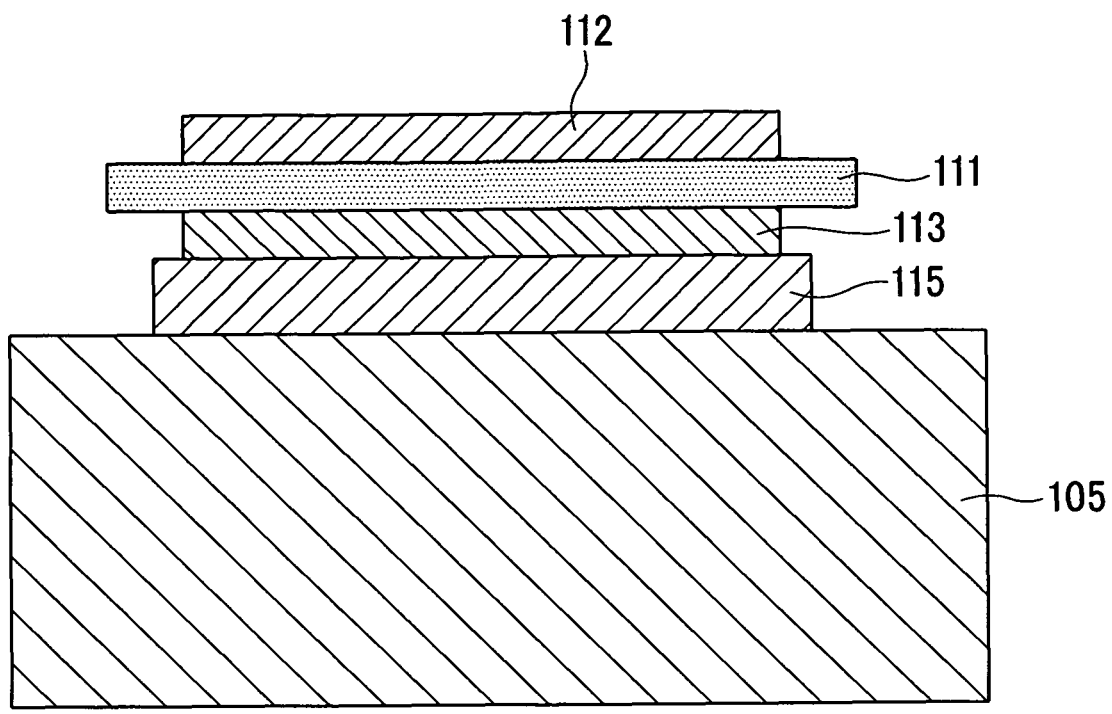
FIG. 10 is a cross-sectional view showing a power module substrate used in a comparison experiment.

As shown in FIG. 10, in comparative examples 4 to 6 and the examples 4 to 6, experiments were performed by use of the same test pieces of power module substrates.

Specifically, the power module substrates have the ceramics substrate 111 composed of $Si_3N_4$ having a thickness of 0.635 mm, the circuit layer 112 composed of 4N aluminum having a thickness of 0.6 mm, the metal layer 113 composed of 4N aluminum having a thickness of 0.6 mm, the top panel section 105 composed of an aluminum alloy (A6063) having a thickness of 5 mm, and the buffer layer 115 composed of 4N aluminum having a thickness of 1.0 mm.

Observation of a joint interface and evaluation of joint strength were performed by use of the test pieces.

When observing the joint interface, a field-emission transmission electron microscope, JEM-2010F produced by JEOL Ltd., was used.

An acceleration voltage was set to 200 kV, and observation of the joint interface was performed.

The test pieces for observation were produced in the following manner.

Firstly, test pieces in which a metal plate is connected to a ceramics substrate were prepared, the test pieces were sliced by a diamond cutter, and a mechanical polishing of the test pieces was performed by use of a diamond grind stone so that the thicknesses of the test pieces became approximately substantially 30 μm.

Subsequently, an ion milling was performed with argon ions (5 kV, 30 μA), and the test pieces for observation including a portion having a thickness of 0.1 μm or less, through which an electron beam can transmit, were produced.

In the observation of the joint interface, 20 points of thicknesses of a high concentration section which was formed on the joint interface were measured, and the average value of the thicknesses was calculated.

The measurement results of average thickness of the high concentration section are shown in Table 2.

In addition, an energy dispersive X-ray spectroscope, a Voyager produced by Noran Instruments Inc., was used, and the joint interface between the metal plate and the ceramics substrate was analyzed.

The assay result is shown in Table 2.

In addition, in the above-described observation by TEM and analyzing by EDS, a two-axis tilt holder for analysis was used.

In evaluation of the joint strength, junction rates were compared to each other after 3000 thermal cycles (−45° C. to 125° C.) were reiterated.

The evaluation results are shown in Table 2.

TABLE 2

|  | AMOUNT OF OXYGEN | AVERAGE THICKNESS OF HIGH CONCENTRATION SECTION | JUNCTION RATE (AFTER 3000 TIMES OF CYCLES) |
|---|---|---|---|
| EXAMPLE 4 | 3.2 wt % | 1.1 nm | 92.2% |
| EXAMPLE 5 | 7.9 wt % | 0.9 nm | 93.1% |
| EXAMPLE 6 | 10.1 wt % | 0.1 nm | 95.7% |
| COMPARATIVE EXAMPLE 4 | 30.0 wt % | 5.5 nm | 62.1% |
| COMPARATIVE EXAMPLE 5 | 28.9 wt % | 4.9 nm | 66.0% |
| COMPARATIVE EXAMPLE 6 | 24.2 wt % | 4.4 nm | 73.7% |

In comparative examples 4 to 6 in which the high concentration section having oxygen that is concentrated at the joint interface is formed, and in which the thickness of the high concentration section is greater than 4 nm, it was confirmed that the junction rate after thermal cycle test was low and the thermal cycle reliability was degraded.

On the other hand, in the examples 4 to 6 in which the high concentration section having oxygen that is concentrated at the joint interface is formed, and in which the thickness of the high concentration section is less than or equal to 4 nm, it was confirmed that the junction rate is 90% or more even after 3000 thermal cycles, and the thermal cycle reliability was improved.

Third Example

A comparison experiment which is performed in order to confirm availability of the present invention will be described.

A third example described below corresponds to the above-described third embodiment.

Figure 15:
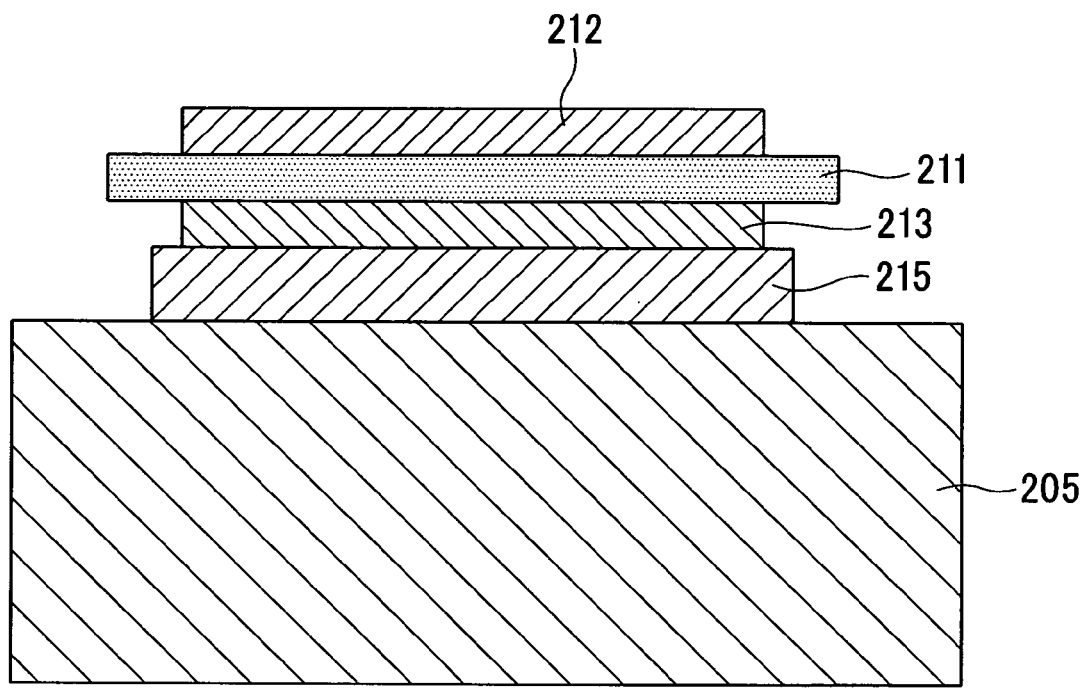
FIG. 15 is a cross-sectional view showing a power module substrate used in a comparison experiment.

As shown in FIG. 15, in comparative examples 7 to 9 and the examples 7 to 9, experiments were performed by use of the same test pieces of power module substrates.

Specifically, the power module substrates mutually have the ceramics substrate 211 composed of $Al_2O_3$ having a thickness of 0.635 mm, the circuit layer 212 composed of 4N aluminum having a thickness of 0.6 mm, the metal layer 213 composed of 4N aluminum having a thickness of 0.6 mm, the top panel section 205 composed of an aluminum alloy (A6063) having a thickness of 5 mm, and the buffer layer 215 composed of 4N aluminum having a thickness of 1.0 mm.

Observation of a joint interface and evaluation of joint strength were performed by use of the test pieces.

When observing the joint interface, a field-emission transmission electron microscope, JEM-2010F produced by JEOL Ltd., was used.

An acceleration voltage was set to 200 kV, and observation of the joint interface was performed.

The test pieces for observation were produced in the following manner.

Firstly, test pieces in which a metal plate is connected to a ceramics substrate were prepared, the test pieces were sliced by a diamond cutter, and a mechanical polishing of the test pieces was performed by use of a diamond grind stone so that the thicknesses of the test pieces became approximately substantially 30 μm.

Subsequently, an ion milling was performed with argon ions (5 kV, 30 μA), and the test pieces for observation including a portion having a thickness of 0.1 μm or less, through which an electron beam can transmit, were produced.

In the observation of the joint interface, 20 points of thicknesses of a high concentration section which was formed on the joint interface were measured, and the average value of the thicknesses was calculated.

The measurement results of average thickness of the high concentration section are shown in Table 3.

In addition, an energy dispersive X-ray spectroscope, a Voyager produced by Noran Instruments Inc., was used, and the joint interface between the metal plate and the ceramics substrate was analyzed.

The assay result is shown in Table 3.

Here, as a result of analyzing the positions that are separated from the joint interface by 50 nm in the metal plate in a similar manner as described above, the silicon concentration (the silicon concentration in the metal plate) was 0.2 to 0.3 wt %.

In addition, in the above-described observation by TEM and analyzing by EDS, a two-axis tilt holder for analysis was used.

In evaluation of the joint strength, junction rates were compared to each other after 3000 thermal cycles (−45° C. to 125° C.) were reiterated.

The evaluation results are shown in Table 3.

TABLE 3

|  | AMOUNT OF SILICON | AVERAGE THICKNESS OF HIGH CONCENTRATION SECTION | JUNCTION RATE (AFTER 3000 TIMES OF CYCLES) |
|---|---|---|---|
| EXAMPLE 7 | 2.9 wt % | 1.7 nm | 91.9% |
| EXAMPLE 8 | 3.3 wt % | 0.3 nm | 95.6% |
| EXAMPLE 9 | 3.7 wt % | 0.0 nm | 97.2% |
| COMPARATIVE EXAMPLE 7 | 0.4 wt % | 5.1 nm | 72.1% |
| COMPARATIVE EXAMPLE 8 | 0.8 wt % | 4.7 nm | 73.3% |
| COMPARATIVE EXAMPLE 9 | 0.9 wt % | 4.0 nm | 78.8% |

In comparative examples 7 to 9 in which silicon did not exist in the joint interface with a high degree of concentration, it was confirmed that the junction rate after thermal cycle test was low and the thermal cycle reliability was degraded.

On the other hand, in the examples 7 to 9 in which silicon exists in the joint interface with the silicon concentration that is more than five times that of the metal plate, it was confirmed that the junction rate is 90% or more even after 3000 thermal cycles, and the thermal cycle reliability was improved.

In addition, in the example 9, the thickness of the high concentration section is 0.0 nm, all of 20 points of measurement values were 0.0 nm as a result of observation using a transmission electron microscope.

In addition, in the above-described manner, even if the high concentration section was not clearly observed, as a result of analyzing the joint interface with the EDS, the silicon concentration was 5.5 wt % which is more than five times the silicon concentration in the metal plate (0.2 to 0.3 wt %), and it was obvious that the high concentration section exists.

INDUSTRIAL APPLICABILITY

As described above in detail, the present invention is applicable to a power module substrate having high level of thermal cycle reliability, in which a metal plate is reliably connected to a ceramics substrate, in addition to a power module including the power module substrate, and a method for manufacturing a power module substrate.

What is claimed is:

1. A power module substrate comprising:
a ceramics substrate composed of AlN, having a top face;
a metal plate composed of aluminum having a purity of 99.99% or more and joined to the top face of the ceramics substrate with a brazing filler metal including silicon interposed therebetween; and
a high concentration section formed at a joint interface at which the metal plate is joined to the ceramics substrate, having a silicon concentration that is more than five times the silicon concentration in the metal plate,
wherein an oxygen concentration in the high concentration section is greater than oxygen concentrations in the metal plate and the ceramics substrate, and a thickness of the high concentration section is less than or equal to 4 nm, and
a mass ratio of Al, Si, O and N is Al:Si:O:N=40 to 80 wt %:2 to 10 wt %:20 wt % or less: 10 to 40 wt % when the joint interface including the high concentration section is analyzed by an energy dispersive X-ray spectroscopy.

2. The power module substrate according to claim 1, wherein a thickness of the ceramics substrate is in a range of 0.2 to 1.5 mm.

3. A power module comprising:
a power module substrate according to claim 1; and
an electronic component mounted on the power module substrate.

* * * * *